(12) United States Patent
Saitoh et al.

(10) Patent No.: US 12,310,201 B2
(45) Date of Patent: May 20, 2025

(54) DISPLAY DEVICE WITH SLITS AND ISLAND-SHAPED PROTRUDING PORTIONS IN THE BENDING REGIONS

(71) Applicant: SHARP KABUSHIKI KAISHA, Osaka (JP)

(72) Inventors: Takao Saitoh, Sakai (JP); Masahiko Miwa, Sakai (JP); Masaki Yamanaka, Sakai (JP); Yi Sun, Sakai (JP); Yohsuke Kanzaki, Sakai (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 18/758,386

(22) Filed: Jun. 28, 2024

(65) Prior Publication Data

US 2024/0357888 A1    Oct. 24, 2024

Related U.S. Application Data

(62) Division of application No. 17/598,166, filed as application No. PCT/JP2019/014256 on Mar. 29, 2019, now Pat. No. 12,069,915.

(51) Int. Cl.

| | |
|---|---|
| *H10K 59/131* | (2023.01) |
| *H10K 59/12* | (2023.01) |
| *H10K 71/00* | (2023.01) |
| *H10K 77/10* | (2023.01) |
| *H10K 102/00* | (2023.01) |

(52) U.S. Cl.
CPC .......... *H10K 59/131* (2023.02); *H10K 71/00* (2023.02); *H10K 59/1201* (2023.02); *H10K 77/111* (2023.02); *H10K 2102/311* (2023.02); *H10K 2102/351* (2023.02)

(58) Field of Classification Search
CPC .. H10K 59/131; H10K 59/1201; H10K 71/00; H10K 71/40; H10K 77/111; H10K 2102/311; H10K 2102/351; G09F 9/00; H05B 33/02; H05B 33/06; H05B 33/12
See application file for complete search history.

(56) References Cited

U.S. PATENT DOCUMENTS

| | | | |
|---|---|---|---|
| 2016/0181346 A1* | 6/2016 | Kwon | H10K 59/131 257/40 |
| 2017/0125505 A1* | 5/2017 | Oh | H10K 59/1213 |
| 2019/0129227 A1* | 5/2019 | Hanada | H05K 1/189 |

* cited by examiner

*Primary Examiner* — Marcos D. Pizarro
*Assistant Examiner* — Tiberiu Dan Onuta
(74) *Attorney, Agent, or Firm* — ScienBiziP, P.C.

(57) ABSTRACT

A display device includes a resin substrate and a thin film transistor layer. The thin film transistor layer includes a first inorganic insulating film, a second inorganic insulating film, and a lead-out wiring line. A frame region includes a bending portion provided with a slit constituted with a first slit and a second slit. Portions of the first inorganic insulating film on both sides in a width direction of the first slit constituting step portions are exposed from the second inorganic insulating film inside the second slit. The lead-out wiring line is electrically connected to the thin film transistor. The step portions are provided with a protruding portion having an island shape. The lead-out wiring line includes an opening covering perimeter edge surface of the protruding portion and exposing an upper face of the protruding portion.

11 Claims, 23 Drawing Sheets

DISPLAY DEVICE WITH SLITS AND ISLAND-SHAPED PROTRUDING PORTIONS IN THE BENDING REGIONS

CROSS-REFERENCE TO RELATED APPLICATIONS

This application is a division of U.S. patent application Ser. No. 17/598,166, filed on Sep. 24, 2021, which is the National Stage of International Application No. PCT/JP2019/014256, filed on Mar. 29, 2019, the contents of which are entirely incorporated herein by reference.

TECHNICAL FIELD

The technique of the present disclosure relates to a display device and a manufacturing method thereof.

BACKGROUND ART

In recent years, self-luminous type organic Electro Luminescence (hereinafter also referred to as EL) display devices using organic EL elements have attracted attention as display devices that can replace liquid crystal display devices. As an organic EL display device, a flexible organic EL display device in which thin film transistors (hereinafter, referred to as "TFTs") or organic EL elements are provided on a resin substrate having flexibility is proposed.

The organic EL display device is provided with a display region for displaying an image and a frame region located on the periphery of the display region. Furthermore, for the organic EL display device, it is desirable to reduce the frame region. In a flexible organic EL display device, the frame region on a terminal portion side is bent in order to reduce an area occupied by the frame region in a plan view.

In such an organic EL display device, an inorganic insulating layer in a bending portion may be removed in order to alleviate the bending stress generated in the bending portion of the frame region. For example, in the organic EL display device disclosed in PTL 1, in a slit where an inorganic insulating layer is removed at a bending portion, the thickness of the bending portion is reduced stepwise via a plurality of steps, which prevents wiring line breakage.

CITATION LIST

Patent Literature

PTL 1: JP 2018-78057 A

SUMMARY

Technical Problem

In the organic EL display device disclosed in PTL 1, a lead-out wiring line is drawn from a display region side to a terminal portion through a plurality of steps in the bending portion. Thus, in a step portion between adjacent steps, the lead-out wiring line may be pulled to both sides due to stress generated in a wiring portion formed in one step and another step, and this may cause stress to be concentrated at a particular portion of the lead-out wiring line, which may cause breakage or peeling.

The technique of the present disclosure has been made in view of such points, and an object of the present disclosure is to prevent breakage and peeling of a lead-out wiring line in a bending portion of a display device.

Solution to Problem

The technique of the present disclosure is directed to a display device including a resin substrate having flexibility and a TFT layer provided on the resin substrate.

The TFT layer includes a plurality of TFTs. The TFT layer includes a first inorganic insulating film including an inorganic insulating layer, a second inorganic insulating film including an inorganic insulating layer provided on the first inorganic insulating film, and a lead-out wiring line provided on the second inorganic insulating film.

The display device is provided with a display region configured to display an image by action of the TFTs, and a frame region located on a periphery of the display region. The frame region includes a bending portion that is bent around a bending axis extending in a first direction. In this bending portion, a slit extending in the first direction is provided in the TFT layer.

The slit is constituted with a first slit formed in the first inorganic insulating film and a second slit formed in the second inorganic insulating film having a width wider than the first slit. Portions of the first inorganic insulating film on both sides in a width direction of the first slit constitute step portions that are exposed from the second inorganic insulating film inside the second slit. The step portions in the slit are provided with island-shaped protruding portions.

The lead-out wiring line is electrically connected to the TFT. The lead-out wiring line extends through the step portions from one side to the other side of the slit in a second direction that intersects with the first direction in which the bending axis extends. Furthermore, the lead-out wiring line includes an opening that covers the perimeter edge surfaces of the protruding portion provided in the step portion within the slit and exposes the upper face of the protruding portion.

Advantageous Effects of Disclosure

According to the display device described above, the protruding portion is provided in the step portion within the slit provided in the bending portion, and the lead-out wiring line traversing the slit is provided in a manner including an opening that covers the perimeter edge surfaces of the protruding portion and exposes the upper face of the protruding portion. Thus, the adhesion of the lead-out wiring line in the step portion can be improved, and stress concentration at a specific portion of the lead-out wiring line can be alleviated even when the lead-out wiring line is pulled to both sides due to stress generated in the wiring portion formed in one step and another step. As a result, it is possible to prevent the lead-out wiring line from being broken or peeled off at the bending portion of the display device.

DESCRIPTION OF EMBODIMENTS

Exemplary embodiments will be described below in detail with reference to the drawings.

Note that, in the following embodiments, a description that a constituent element such as a film, layer, element, or the like is provided or formed on another constituent element such as another film, layer, element, or the like means not only a case where a constituent element is provided directly on another constituent element, but also a case where, between a constituent element and another constituent element, still another constituent element such as still another film, layer, element, or the like is interposed.

In the following embodiments, a description that a constituent element such as a film, layer, element, or the like is connected to another constituent element such as another film, layer, element, or the like means that a constituent element is electrically connected to another constituent element unless otherwise specifically stated, and in a scope not departing from the gist of the technique of the present disclosure, includes not only a case meaning a direct connection but also a case meaning an indirect connection through still another constituent element such as still another film, layer, element, or the like, and may also include a case where a constituent element is integrated into another component element, that is, a part of a constituent component constitutes another constituent component.

In the following embodiments, the description of "the same layer" refers to a film or a layer formed through the same process as in the film or the layer to be compared, the description of "a lower layer" refers to a film, a layer, or an element formed in a process before a process in which the film, the layer, or the element to be compared is formed, and the description of "an upper layer" refers to a film or a layer formed in a process after the process in which the film or the layer to be compared is formed.

First Embodiment

Configuration of Organic EL Display Device

Figure 1:
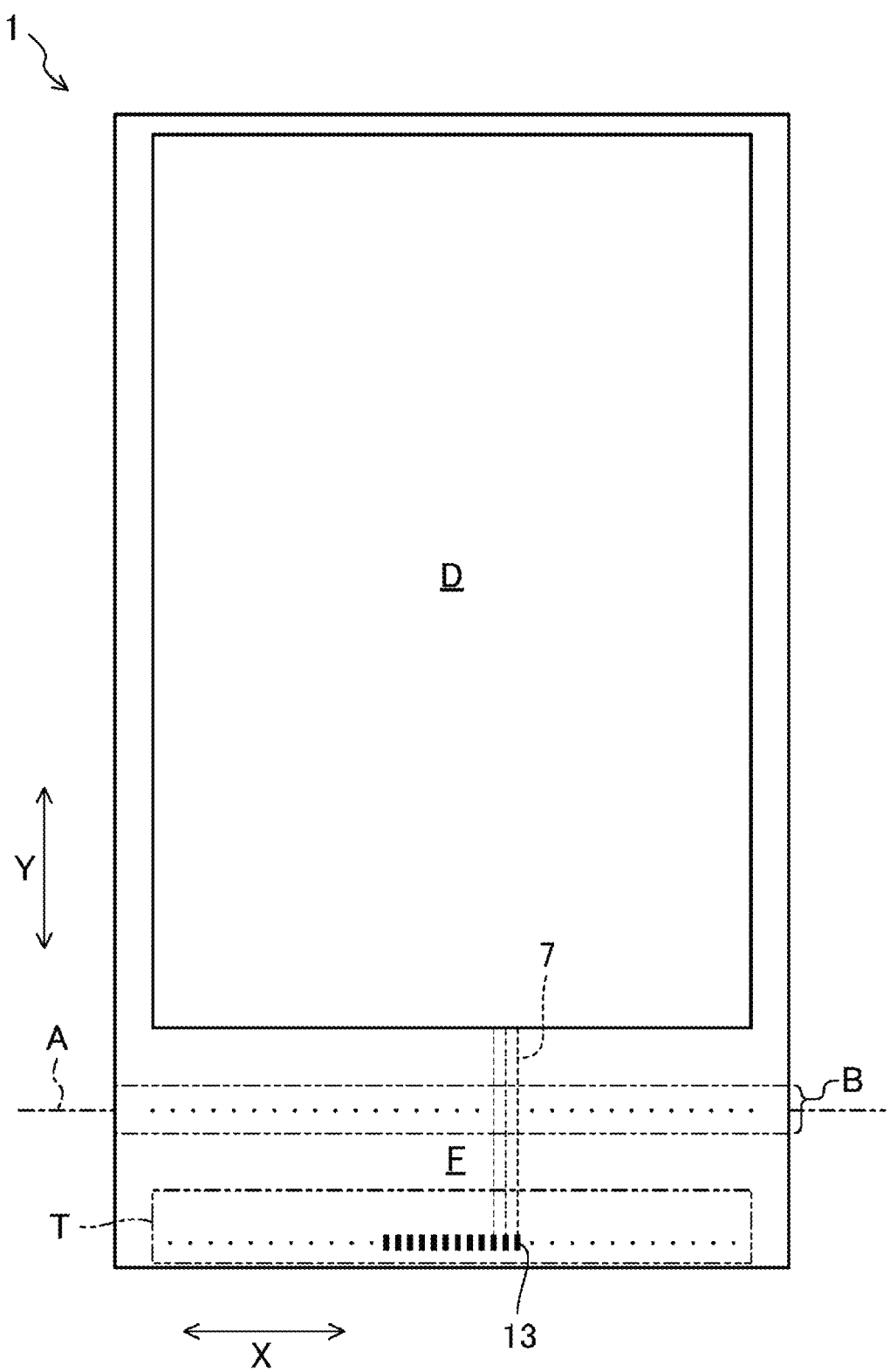
FIG. 1 is a plan view illustrating a schematic configuration of an organic EL display device according to a first embodiment.
Figure 2:
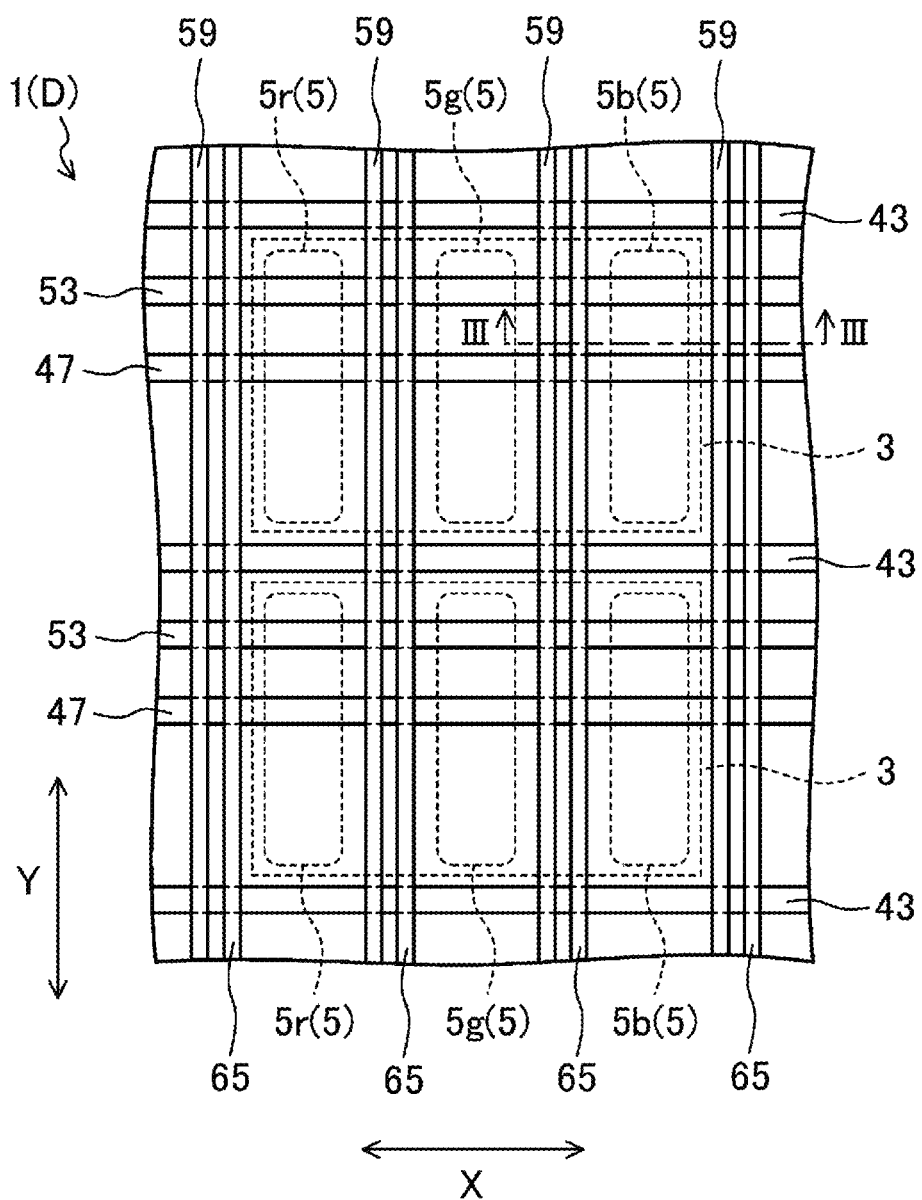
FIG. 2 is a plan view illustrating a configuration of a display region of the organic EL display device according to the first embodiment.
Figure 3:
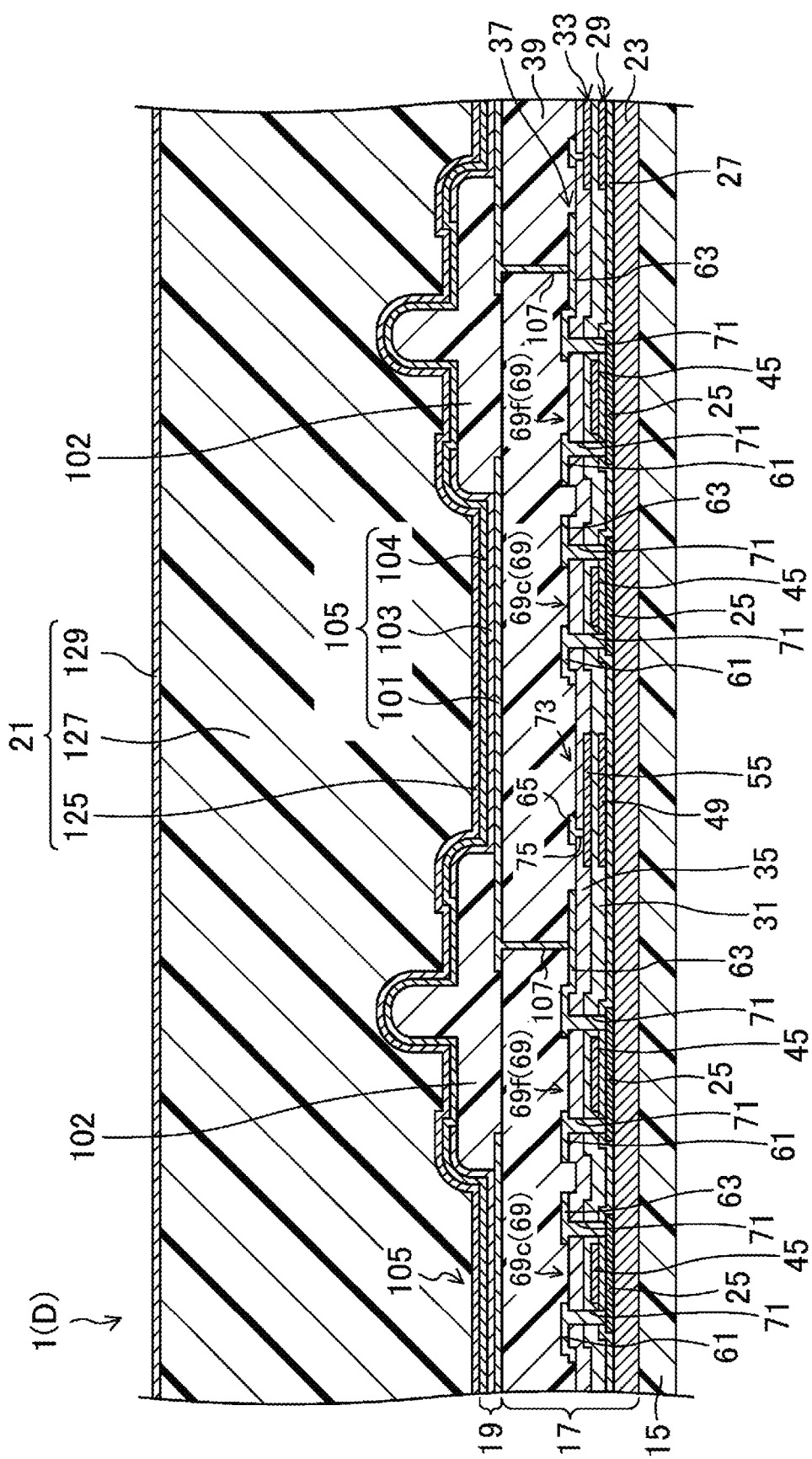
FIG. 3 is a cross-sectional view of the organic EL display device taken along the line III-III in FIG. 2.
Figure 4:
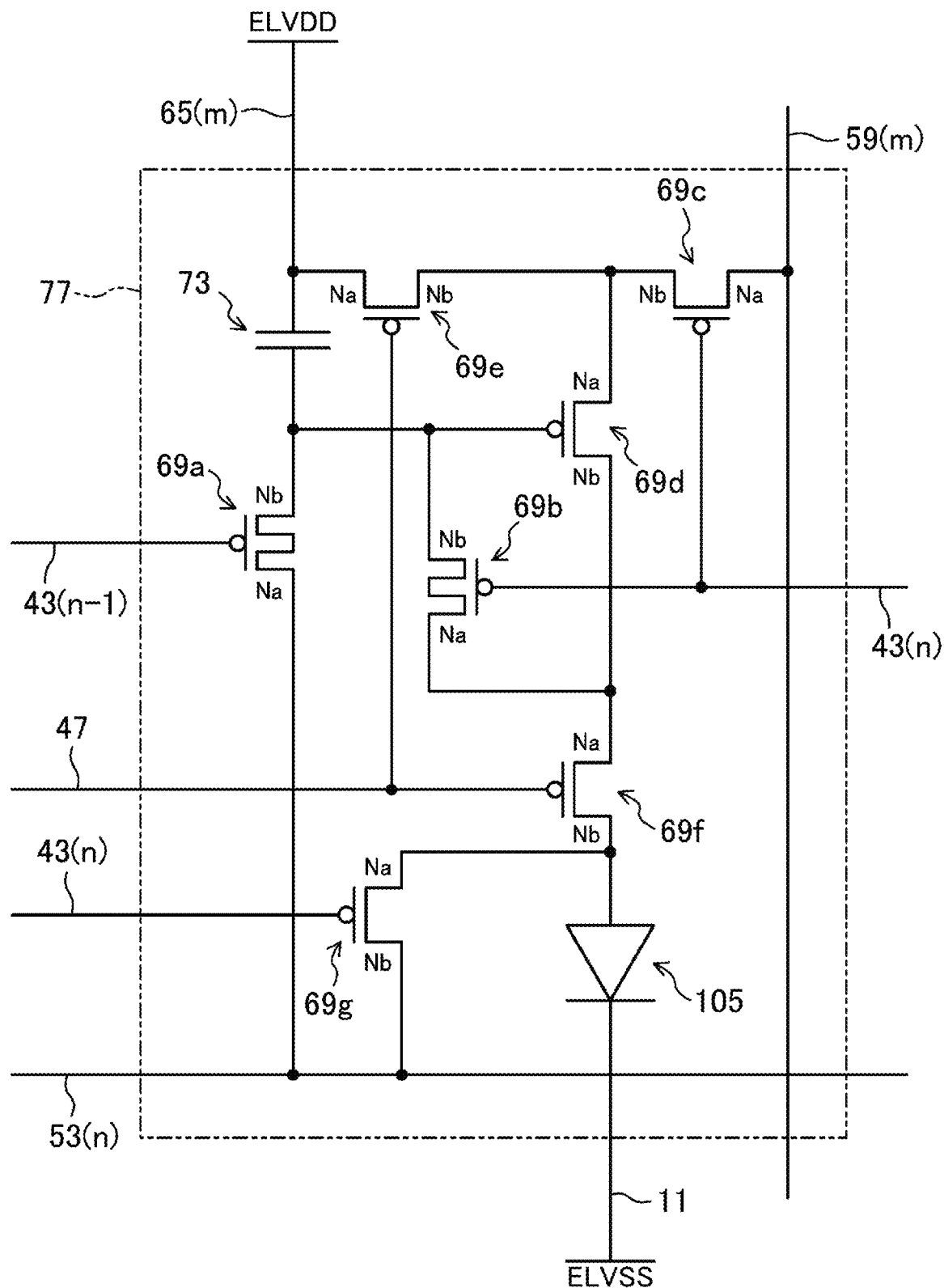
FIG. 4 is an equivalent circuit diagram of a part of a TFT layer configuring the organic EL display device according to the first embodiment.

FIG. 1 is a plan view illustrating a schematic configuration of an organic EL display device 1 according to a first embodiment. FIG. 2 is a plan view illustrating a configuration of a display region D of the organic EL display device 1 according to the first embodiment. FIG. 3 is a cross-sectional view of the organic EL display device 1 taken along the line III-III in FIG. 2. FIG. 4 is an equivalent circuit diagram of a part of a TFT layer 17 configuring the organic EL display device 1 according to the first embodiment.

Schematic Configuration of Organic EL Display Device

As illustrated in FIG. 1, the organic EL display device 1 includes a display region D configured to display an image and a frame region F located on the periphery of the display region D.

The display region D is a rectangular region constituting the screen, and includes a plurality of pixels 3 as illustrated in FIG. 2. The plurality of pixels 3 are arranged in a matrix shape, for example. For example, each of the pixels 3 includes subpixels 5 of three colors composed of a subpixel 5r for emitting light of a red color, a subpixel 5g for emitting light of a green color, and a subpixel 5b for emitting light of a blue color. The subpixels of the three colors 5r, 5g, and 5b are arranged in a stripe shape, for example.

Here, in the first embodiment, the display region D having the rectangular shape is exemplified, but the "rectangular shape" here includes, for example, a substantial rectangular shape such as a rectangular shape whose sides are arc-shaped, a rectangular shape whose corners are arc-shaped, and a rectangular shape in which a part of a side has a notch.

The frame region F is a rectangular frame-shaped region constituting a non-display portion other than the screen. A terminal portion T to be connected to an external circuit is provided in a portion constituting one side of the frame region F. The frame region F includes a bending portion B that is bent around a bending axis A that extends between the display region D and the terminal portion T in the first direction X that is the horizontal direction in FIG. 1.

The terminal portion T is disposed on the back side of the organic EL display device 1 by the frame region F being bent, for example, by 180° (in a U shape) at the bending portion B. The terminal portion T is connected to a wiring line substrate such as a Flexible Printed Circuit (FPC). A plurality of lead-out wiring lines 7 drawn from the display region D to the terminal portion T are provided in the frame region F.

In the frame region F, a drive circuit including a gate driver, an emission driver, and the like is monolithically provided, although not illustrated, in a portion that constitutes sides adjacent to the side where the terminal portion T is provided with (both left and right sides in FIG. 1). The lead-out wiring line 7 is also pulled out from the drive circuit toward the terminal portion T. A low-level power source wiring line (not illustrated) is provided in the frame region F so as to surround the display region D. The low-level power source wiring line is also drawn toward the terminal portion T to form a lead-out wiring line 7.

A plurality of wiring line terminals 13 for conducting communication with the lead-out wiring lines 7 provided in the frame region F are provided in a predetermined pattern in the terminal portion T. The organic EL display device 1 is connected to a high level voltage power supply (ELVDD), a low level voltage power supply (ELVSS), and a display control circuit via the wiring line substrate by the plurality of wiring line terminals 13.

The organic EL display device 1 employs an active matrix driving method in which light emission from each subpixel 5 is controlled by a TFT 69 and an image is displayed by the action of the TFT 69. As illustrated in FIG. 3, the organic EL display device 1 includes a resin substrate layer 15, a TFT layer 17 provided on the resin substrate layer 15, a light-emitting element layer 19 provided on the TFT layer 17, and a sealing film 21 provided on the light-emitting element layer 19.

Configuration of Resin Substrate Layer

The resin substrate layer 15 is, for example, a resin substrate having a thickness of approximately 10 μm to 20 μm, and has flexibility. The resin substrate layer 15 is formed of, for example, an organic material such as a polyimide resin, a polyamide resin, or an epoxy resin. The resin substrate layer 15 may be composed of a layered film of an inorganic insulating layer made of an inorganic material such as silicon oxide (SiOx), silicon nitride (SiNy), silicon oxynitride (SiOxNy) (x and y are positive numbers, the same applies hereinafter), and the resin layer described above.

Configuration of TFT Layer

The TFT layer 17 includes a base coat layer 23, a semiconductor layer 25, a gate insulating layer 27, a gate conductive layer 29, a first interlayer insulating layer 31, an intermediate conductive layer 33, a second interlayer insulating layer 35, a source conductive layer 37, and a flattened layer 39, which are sequentially provided on the resin substrate layer 15. The base coat layer 23 constitutes a first inorganic insulating film 24. The gate insulating layer 27, the first interlayer insulating layer 31, and the second interlayer insulating layer 35 constitute a second inorganic insulating film 36.

The base coat layer 23 is formed of a single-layer film or a layered film of an inorganic insulating layer of silicon oxide (SiOx), silicon nitride (SiNy), silicon oxynitride (SiOxNy), or the like. The thickness of the base coat layer 23 is, for example, approximately 1 μm.

The semiconductor layer 25 is provided in an island shape. The semiconductor layer 25 is formed of a Low Temperature Polycrystalline Silicon (LTPS), an In—Ga—Zn—O based oxide semiconductor, or the like, for example. The thickness of the semiconductor layer 25 is, for example, approximately 40 nm.

The gate insulating layer 27 is provided so as to cover the semiconductor layer 25. The gate insulating layer 27 is formed of a single-layer film or a layered film of an inorganic insulating layer of, for example, silicon oxide (SiOx), silicon nitride (SiNy), silicon oxynitride (SiOxNy), or the like.

The gate conductive layer 29 includes a plurality of gate wiring lines 43, a plurality of gate electrodes 45, a plurality of emission control wiring lines 47, a plurality of first capacitance electrodes 49, and a plurality of first lead-out wiring lines 7a. That is, the gate wiring lines 43, the gate electrodes 45, the emission control wiring lines 47, the first capacitance electrodes 49, and the first lead-out wiring lines 7a are formed by the same material in the same layer. The thickness of the gate wiring lines 43, the gate electrodes 45, the emission control wiring lines 47, the first capacitance electrodes 49, and the first lead-out wiring lines 7a are, for example, approximately 200 nm to 300 nm.

The gate wiring lines 43, the gate electrodes 45, the emission control wiring lines 47, the first capacitance electrodes 49, and the first lead-out wiring lines 7a are formed of a single-layer film or a layered film of a metal layer of, for example, aluminum (Al), tungsten (W), molybdenum (Mo), tantalum (Ta), chromium (Cr), titanium (Ti), copper (Cu), or the like. The gate wiring lines 43, the emission control wiring lines 47, and the first lead-out wiring lines 7a are examples of the first wiring line.

The first interlayer insulating layer 31 is provided so as to cover the gate wiring line 43, the gate electrode 45, the emission control wiring line 47, and the first capacitance electrode 49. The first interlayer insulating layer 31 is formed of a single-layer film or a layered film of an inorganic insulating film of, for example, silicon oxide (SiOx), silicon nitride (SiNy), silicon oxynitride (SiOxNy), or the like. The thickness of the first interlayer insulating layer 31 is, for example, approximately 100 nm.

The intermediate conductive layer 33 includes a plurality of initialization power source wiring lines 53, and a plurality of second capacitance electrodes 55. The initialization power source wiring lines 53 and the second capacitance electrodes 55 are formed by the same material in the same layer. The initialization power source wiring lines 53 and the second capacitance electrodes 55 are formed of a single-layer film or a layered film of a metal layer of, for example, aluminum (Al), tungsten (W), molybdenum (Mo), tantalum (Ta), chromium (Cr), titanium (Ti), copper (Cu), or the like. The initialization power source wiring line 53 is an example of the second wiring line.

The second interlayer insulating layer 35 is provided so as to cover the initialization power source wiring line 53 and the second capacitance electrode 55 on the first interlayer insulating layer 31. The second interlayer insulating layer 35 is formed of a single-layer film or a layered film of an inorganic insulating film of, for example, silicon oxide (SiOx), silicon nitride (SiNy), silicon oxynitride (SiOxNy), or the like. The thickness of the second interlayer insulating layer 35 is, for example, approximately 500 nm.

The source conductive layer 37 includes a plurality of source wiring lines 59, a plurality of source electrodes 61, a plurality of drain electrodes 63, a plurality of high-level power source wiring lines 65, a low-level power source wiring line, and a plurality of second lead-out wiring lines 7b. The source wiring lines 59, the source electrodes 61, the drain electrodes 63, the high-level power source wiring lines 65, the low-level power source wiring line, and the second lead-out wiring lines 7b are formed by the same material in the same layer. The thickness of the source wiring lines 59, the source electrodes 61, the drain electrodes 63, the high-level power source wiring lines 65, the low-level power source wiring line, and the second lead-out wiring lines 7b are, for example, approximately 600 nm to 700 nm.

The source wiring lines 59, the source electrodes 61, the drain electrodes 63, the high-level power source wiring lines 65, the low-level power source wiring line, and the second lead-out wiring lines 7b are formed of a single-layer film or a layered film of a metal layer of, for example, aluminum (Al), tungsten (W), molybdenum (Mo), tantalum (Ta), chromium (Cr), titanium (Ti), copper (Cu), or the like. The source wiring lines 59, the high-level power source wiring lines 65, the low-level power source wiring line, and the second lead-out wiring lines 7b are examples of the third wiring line.

Configuration of Wiring Line for Display

The plurality of gate wiring lines 43 are provided in the display region D and extend parallel to each other in the first direction X. The gate wiring lines 43 are each a wiring line configured to transmit a gate signal and provided for each row of the subpixels 5. The gate wiring lines 43 are each connected to a gate driver included in the drive circuit, and are sequentially selected at a predetermined timing to change to an active state.

A plurality of emission control wiring lines 47 are provided in the display region D and extend parallel to each other in the first direction X. The emission control wiring lines 47 are each a wiring line configured to transmit an emission control signal and provided for each row of the subpixels 5. The emission control wiring lines 47 are each connected to the emission driver included in the drive circuit, and are sequentially selected at a predetermined timing to change to an inactive state.

The plurality of initialization power source wiring lines 53 are provided in the display region D and extend parallel to each other in the first direction X. The initialization power source wiring lines 53 are each a wiring line configured to impart an initialization potential and provided for each row of the subpixels 5. The initialization power source wiring lines 53 are each drawn from the display region D to the terminal portion T as the lead-out wiring line 7 and connected to the initialization voltage power supply via the wiring line substrate at the terminal portion T.

The plurality of source wiring lines 59 are provided in the display region D and extend parallel to each other in a second direction Y, which is the vertical direction in FIG. 1 orthogonal to the first direction X. The source wiring lines 59 are each a wiring line configured to carry a source signal and provided for each column of the subpixels 5. The source wiring lines 59 are each drawn from the display region D to the terminal portion T as the lead-out wiring line 7 and connected to the display control circuit via the wiring line substrate at the terminal portion T.

The plurality of high-level power source wiring lines 65 are provided in the display region D and extend parallel to each other in the second direction Y. The high-level power source wiring lines 65 are each a wiring line configured to impart a predetermined high level potential and provided for each column of the subpixels 5. Each of the high-level power source wiring lines 65 is drawn from the display region D to the terminal portion T as the lead-out wiring line 7, and is connected to the high level voltage power supply (ELDVV) via the wiring line substrate at the terminal portion T. The high-level power source wiring line 65 is supplied with a high level power supply voltage that is a first power supply voltage from the high level voltage power supply (ELDVV) through the terminal portion T.

Each of the high-level power source wiring lines 65 may be constituted by a combination of a first high-level power source wiring line extending in the first direction X and a second high-level power source wiring line extending in the second direction. In this case, the first high-level power source wiring line is included in the intermediate conductive layer 33, and constitutes the second wiring line. The second high-level power source wiring line is included in the source conductive layer 37, and constitutes the third wiring line. The first high-level power source wiring line and the second high-level power source wiring line are connected via a contact hole formed in the second interlayer insulating layer 35.

The low-level power source wiring line extends in the frame region F so as to surround the display region D except on one side of the terminal portion T side. The low-level power source wiring line is a wiring line configured to impart a predetermined low-level potential, and is provided in common to the plurality of subpixels 5. The low-level power source wiring line is drawn to the terminal portion T, and is connected to the low level voltage power supply (ELVSS) via the wiring line substrate at the terminal portion T. The low-level power source wiring line is supplied with a low level power supply voltage that is different from the high level power supply voltage through the terminal portion T.

Figure 6:
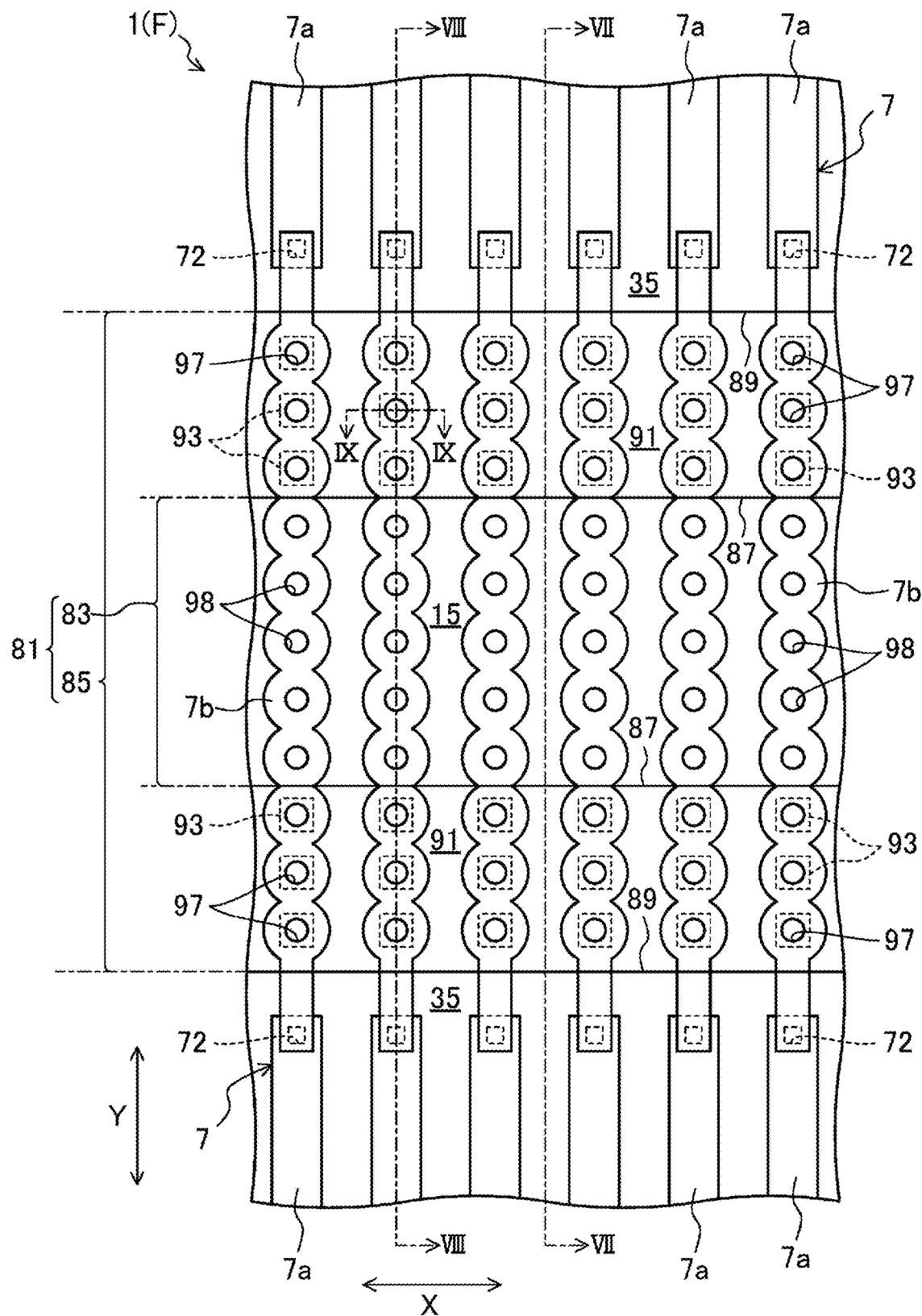
FIG. 6 is a plan view illustrating a configuration of a bending portion and the periphery thereof of the organic EL display device according to the first embodiment.
Figure 8:
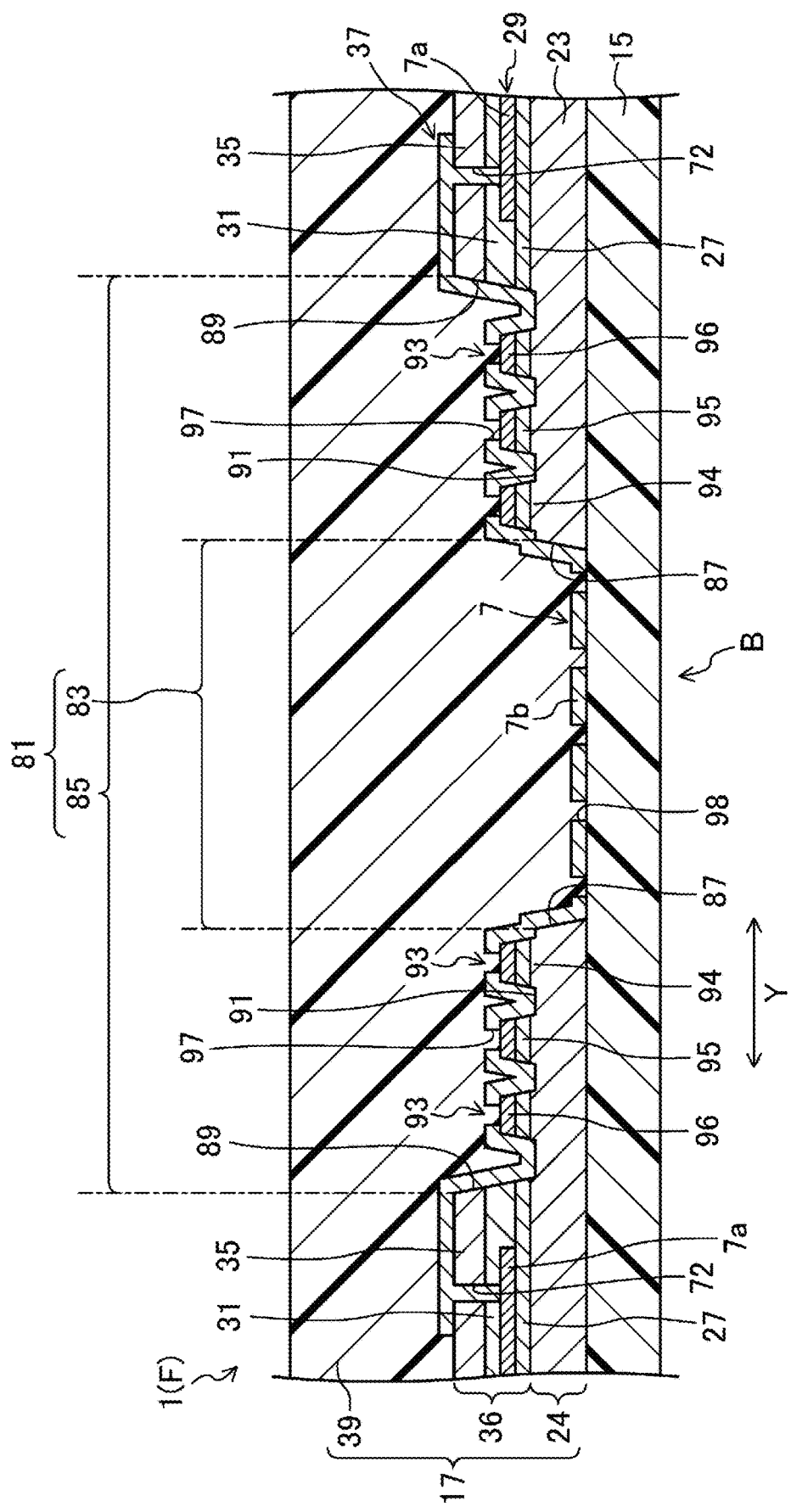
FIG. 8 is a cross-sectional view of the bending portion and the periphery thereof of the organic EL display device taken along the line VIII-VIII in FIG. 6.

The first lead-out wiring line 7a and the second lead-out wiring line 7b are connected to each other to form a lead-out wiring line 7 (see FIG. 6 and FIG. 8). The lead-out wiring line 7 constitutes a wiring portion drawn out from the frame region F to the terminal portion T of the wiring of the initialization power source wiring line 53, the source wiring line 59, the high-level power source wiring line 65, the low-level power source wiring line, and the drive circuit.

Elements and Circuits of Subpixels

The semiconductor layer 25, the gate insulating layer 27, the gate electrode 45, the first interlayer insulating layer 31, the second interlayer insulating layer 35, the source electrode 61, and the drain electrode 63 constitute the TFT 69.

Each of the gate electrodes 45 is provided so as to overlap a part (channel region) of the semiconductor layer 25 with the gate insulating layer 27 interposed therebetween. The source electrode 61 and the drain electrode 63 are separated from each other. The source electrode 61 and the drain electrode 63 are connected to respective different portions (source region and drain region) at locations between which a region of the semiconductor layer 25 overlapping with the gate electrode 45 is interposed, via a contact hole 71 formed in the gate insulating layer 27, the first interlayer insulating layer 31, and the second interlayer insulating layer 35.

A plurality of TFTs 69 are provided for each of the subpixels 5. In other words, the TFT layer 17 includes the plurality of TFTs 69.

The plurality of TFTs 69 provided for each of the subpixels 5 includes a first TFT 69a, a second TFT 69b, a third TFT 69c, a fourth TFT 69d, a fifth TFT 69e, a sixth TFT 69f, and a seventh TFT 69g. These first to seventh TFTs 69a, 69b, 69c, 69d, 69e, 69f, and 69g employ the top gate structure described above, and are, for example, P-channel type TFTs.

The first capacitance electrode 49, the first interlayer insulating layer 31, and the second capacitance electrode 55 constitute a capacitor 73. At least one capacitor 73 is provided for each of the subpixels 5.

The first capacitance electrode 49 is connected to the first TFT 69a, the second TFT 69b, and the fourth TFT 69d provided in the subpixel 5. The second capacitance electrode 55 is provided so as to face the first capacitance electrode 49 with the first interlayer insulating layer 31 interposed therebetween. The second capacitance electrode 55 is connected to the high-level power source wiring line 65 via a contact hole 75 formed in the second interlayer insulating layer 35.

The first TFT 69a, the second TFT 69b, the third TFT 69c, the fourth TFT 69d, the fifth TFT 69e, the sixth TFT 69f, the seventh TFT 69g, and the capacitor 73 constitute the pixel circuit 77 illustrated in FIG. 4. In the first to seventh TFTs 69a, 69b, 69c, 69d, 69e, 69f, and 69g, the gate electrode 45 corresponds to a control terminal, one electrode of the source electrode 61 and the drain electrode 63 corresponds to a first conduction terminal Na, and the other electrode corresponds to a second conduction terminal Nb.

Note that the pixel circuit 77 illustrated in FIG. 4 is a pixel circuit 77 in the m-th row and n-th column (m and n are positive integers). In FIG. 4, the source wiring line 59 and the high-level power source wiring line 65 to which the reference sign (m) is added are the source wiring line 59 and the high-level power source wiring line 65 corresponding to the subpixels 5 in the m-th row. The gate wiring line 43, the emission control wiring line 47, and the initialization power source wiring line 53 to which the reference sign (n) is added are the gate wiring line 43, the emission control wiring line 47, and the initialization power source wiring line 53 corresponding to the subpixels 5 in the n-th column, and the gate wiring line 43 to which the reference sign (n−1) is added is a gate wiring line 43 that is scanned immediately before the gate wiring line corresponding to the subpixel 5 in the n-th row.

The first TFT 69a is a first initialization TFT provided between the gate wiring line 43, the initialization power source wiring line 53, and the capacitor 73. In the first TFT 69a, the control terminal is connected to the gate wiring line 43, the first conduction terminal Na is connected to the initialization power source wiring line 53, and the second conduction terminal Nb is connected to the first capacitance electrode 49 of the capacitor 73. The gate wiring line 43 to which the control terminal of the first TFT 69a is connected is the gate wiring line 43 that is scanned immediately before the gate wiring line 43 of the corresponding subpixel 5. The first TFT 69a is configured to initialize a voltage on the control terminal of the fourth TFT 69d by applying a voltage of the initialization power source wiring line 53 to the capacitor 73 in response to a selection of the gate wiring line 43.

The second TFT 69b is a threshold value compensation TFT provided between the gate wiring line 43 and the fourth TFT 69d. In the second TFT 69b, the control terminal is connected to the gate wiring line 43, the first conduction terminal Na is connected to the second conduction terminal Nb of the fourth TFT 69d, and the second conduction terminal Nb is connected to the control terminal of the fourth TFT 69d. The second TFT 69b is configured to compensate for the threshold voltage of the fourth TFT 69d by setting the fourth TFT 69d in a diode-connected state in response to a selection of the gate wiring line 43.

The third TFT 69c is a writing TFT provided between the gate wiring line 43, the source wiring line 59, and the fourth TFT 69d. In the third TFT 69c, the control terminal is connected to the gate wiring line 43, the first conduction terminal Na is connected to the source wiring line 59, and the second conduction terminal Nb is connected to the first conduction terminal Na of the fourth TFT 69d. The third TFT 69c is configured to apply a voltage of the source wiring line 59 to the first conduction terminal Na of the fourth TFT 69d in response to a selection of the gate wiring line 43.

The fourth TFT 69d is a drive TFT provided between the first TFT 69a, the second TFT 69b, the capacitor 73, the third TFT 69c, the fifth TFT 69e, and the sixth TFT 69f. The control terminal of the fourth TFT 69d is connected to the second conduction terminal Nb of the second TFT 69b and is connected to the first capacitance electrode 49 of the capacitor 73. The first conduction terminal Na of the fourth TFT 69d is connected to the second conduction terminal Nb of the third TFT 69c and is connected to the second conduction terminal Nb of the fifth TFT 69e. The second conduction terminal Nb of the fourth TFT 69d is connected to the first conduction terminal Na of the second TFT 69b and is connected to the first conduction terminal Na of the sixth TFT 69f. The fourth TFT 69d is configured to apply a drive current corresponding to the voltage between the control terminal and the first conduction terminal Na to the first conduction terminal Na of the sixth TFT 69f.

The fifth TFT 69e is a power supply TFT provided between the emission control wiring line 47, the high-level power source wiring line 65, and the fourth TFT 69d. In the fifth TFT 69e, the control terminal is connected to the emission control wiring line 47, the first conduction terminal Na is connected to the high-level power source wiring line 65, and the second conduction terminal Nb is connected to the first conduction terminal Na of the fourth TFT 69d. The fifth TFT 69e is configured to apply a voltage (high level power supply voltage) of the high-level power source wiring line 65 to the first conduction terminal Na of the fourth TFT 69d in response to a selection of the emission control wiring line 47.

The sixth TFT 69f is a light emission control TFT provided between the emission control wiring line 47, the second TFT 69b, the fourth TFT 69d, and the organic EL element 105. In the sixth TFT 69f, the control terminal is connected to the emission control wiring line 47, the first conduction terminal Na is connected to the second conduction terminal Nb of the fourth TFT 69d, and the second conduction terminal Nb is connected to the first electrode 101 of the organic EL element 105. The sixth TFT 69f is configured to apply a drive current to the organic EL element 105 in response to a selection of the emission control wiring line 47.

The seventh TFT 69g is a second initialization TFT provided between the gate wiring line 43, the initialization power source wiring line 53, and the organic EL element 105. In the seventh TFT 69g, the control terminal is connected to the gate wiring line 43, the first conduction terminal Na is connected to the initialization power source wiring line 53, and the second conduction terminal Nb is connected to the first electrode 101 of the organic EL element 105. The seventh TFT 69g is configured to reset a charge accumulated in the first electrode 101 of the organic EL element 105 in response to a selection of the gate wiring line 43.

The capacitor 73 is a data holding element provided between the high-level power source wiring line 65, the first TFT 69a, and the fourth TFT 69d. The first capacitance electrode 49 of the capacitor 73 is connected to the control terminal of the fourth TFT 69d, and is connected to the second conduction terminal Nb of the first TFT 69a and the second conduction terminal Nb of the second TFT 69b. The second capacitance electrode 55 of the capacitor 73 is connected to the high-level power source wiring line 65. The capacitor 73 is charged by the voltage of the source wiring line 59 when the gate wiring line 43 is in the select state, and holds the voltage written by way of the charging to maintain the voltage applied to the control terminal of the fourth TFT 69d when the gate wiring line 43 is in the non-select state.

In the display region D, the flattened layer 39 covers portions other than a part of the drain electrode 63 of the sixth TFT 69f (such as the source wiring line 59, the source electrode 61, other drain electrode 63, and the high-level power source wiring line 65), thereby flattening the surface of the TFT layer 17 so as to reduce steps due to the surface shapes of the first TFT 69a, the second TFT 69b, the third TFT 69c, the fourth TFT 69d, the fifth TFT 69e, the sixth TFT 69f, and the seventh TFT 69g. The flattened layer 39 is formed of an organic material such as a polyimide resin, for example.

Configuration of Light-Emitting Element Layer

As illustrated in FIG. 3, the light-emitting element layer 19 is provided on the flattened layer 39. The light-emitting element layer 19 includes a first electrode 101, an edge cover 102, an organic EL layer 103, and a second electrode 104, which are sequentially provided on the flattened layer 39.

The first electrode 101, the organic EL layer 103, and the second electrode 104 constitute the organic EL element 105. The organic EL element 105 is provided for each of the subpixels 5. In other words, the light-emitting element layer 19 includes a plurality of organic EL elements 105. The organic EL element 105 is an example of a light-emitting element. The organic EL element 105 employs a top-emitting type structure, for example.

The first electrode 101 is provided in each of the subpixels 5. The first electrode 101 is connected to the drain electrode 63 of the sixth TFT 69f in the corresponding subpixel 5 via a contact hole 107 formed in the flattened layer 39. The first electrode 101 functions as an anode electrode for injecting holes into the organic EL layer 103, and has light reflectivity.

Examples of materials of the first electrode 101 include metallic materials such as silver (Ag), aluminum (Al), vanadium (V), cobalt (Co), nickel (Ni), tungsten (W), gold (Au), titanium (Ti), ruthenium (Ru), manganese (Mn), indium (In), ytterbium (Yb), lithium fluoride (LiF), platinum (Pt), palladium (Pd), molybdenum (Mo), iridium (Ir), and tin (Sn).

Examples of the materials of the first electrode 101 may include alloy such as astatine (At)-astatine oxide (AtO$_2$). Furthermore, examples of the materials of the first electrode 101 may include electrically conductive oxide such as tin oxide (SnO), zinc oxide (ZnO), indium tin oxide (ITO), and indium zinc oxide (IZO).

It is further preferable that the first electrode 101 be formed of a material having a large work function to improve the efficiency of hole injection into the organic EL layer 103. The first electrode 101 may be formed by layering a plurality of layers formed of any of the materials described above.

The edge cover 102 partitions the first electrodes 101 of adjacent subpixels 5. The edge cover 102 is formed in a lattice pattern as a whole and covers the outer circumferential end portion of each of the first electrodes 101. Examples of a material of the edge cover 102 include an organic material of, for example, a polyimide resin, an acrylic resin, a polysiloxane resin, a novolak resin, and the like. A part of the surface of the edge cover 102 protrudes upward to form a photo spacer.

Figure 5:
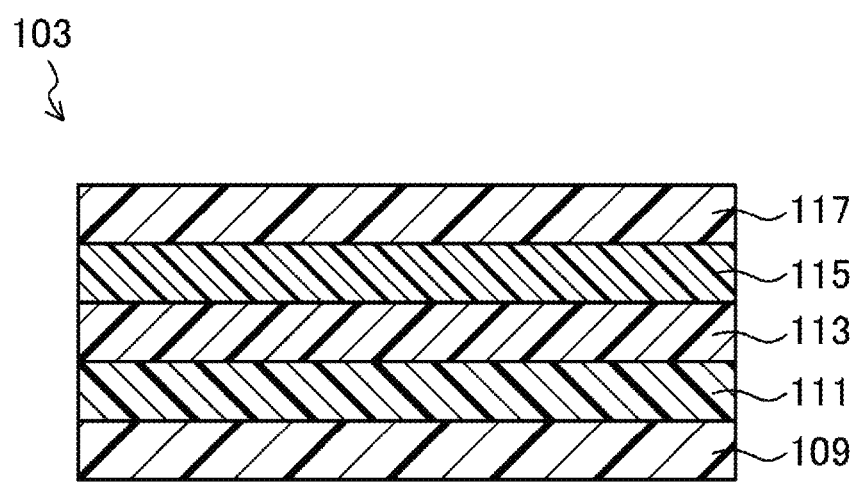
FIG. 5 is a cross-sectional view illustrating a layered structure of an organic EL layer constituting the organic EL display device according to the first embodiment.

The organic EL layer 103 is provided on each of the first electrodes 101. The organic EL layer 103 is an example of a light-emitting function layer. As illustrated in FIG. 5, the organic EL layer 103 includes a hole injection layer 109, a hole transport layer 111, a light-emitting layer 113, an electron transport layer 115, and an electron injection layer 117, which are sequentially provided on the first electrode 101.

The hole injection layer 109 is also referred to as an anode electrode buffer layer, and functions to reduce the energy level difference between the first electrode 101 and the organic EL layer 103, to improve the efficiency of hole injection into the organic EL layer 103 from the first electrode 101. Examples of a material of the hole injection layer 109 include a triazole derivative, an oxadiazole derivative, an imidazole derivative, a polyarylalkane derivative, a pyrazoline derivative, a phenylenediamine derivative, an oxazole derivative, a styrylanthracene derivative, a fluorenone derivative, a hydrazone derivative, a stilbene derivative, and the like, for example.

The hole transport layer 111 functions to migrate holes to the light-emitting layer 113 efficiently. Examples of a material of the hole transport layer 111 include a porphyrin derivative, an aromatic tertiary amine compound, a styrylamine derivative, polyvinylcarbazole, poly-p-phenylenevinylene, polysilane, a triazole derivative, an oxadiazole derivative, an imidazole derivative, a polyarylalkane derivative, a pyrazoline derivative, a pyrazolone derivative, a phenylenediamine derivative, an arylamine derivative, an amine-substituted chalcone derivative, an oxazole derivative, a styrylanthracene derivative, a fluorenone derivative, a hydrazone derivative, a stilbene derivative, hydrogenated amorphous silicon, hydrogenated amorphous silicon carbide, zinc sulfide, and zinc selenide.

The light-emitting layer 113 functions to recombine the holes injected from the first electrode 101 and the electrons injected from the second electrode 104 and emit light in a case where a voltage is applied by the first electrode 101 and the second electrode 104. The light-emitting layer 113 is formed of a material that varies in accordance with a luminescent color (for example, red, green, or blue) of the organic EL element 105 in the individual subpixel 5, for example.

Examples of a material of the light-emitting layer 113 include metal oxinoid compounds (8-hydroxyquinoline metal complexes), naphthalene derivatives, anthracene derivatives, diphenylethylene derivatives, vinyl acetone derivatives, triphenylamine derivatives, butadiene derivatives, coumarin derivatives, benzoxazole derivatives, oxadiazole derivatives, oxazole derivatives, benzimidazole derivatives, thiadiazole derivatives, benzothiazole derivatives, styryl derivatives, styrylamine derivatives, bisstyrylbenzene derivatives, trisstyrylbenzene derivatives, perylene derivatives, perinone derivatives, aminopyrene derivatives, pyridine derivatives, rhodamine derivatives, aquidine derivatives, phenoxazone, quinacridone derivatives, rubrene, poly-p-phenylenevinylene, polysilane and the like, for example.

The electron transport layer 115 functions to facilitate migration of electrons to the light-emitting layer 113 efficiently. Examples of a material of the electron transport layer 115 include an oxadiazole derivative, a triazole derivative, a benzoquinone derivative, a naphthoquinone derivative, an anthraquinone derivative, a tetracyanoanthraquinodimethane derivative, a diphenoquinone derivative, a fluorenone derivative, a silole derivative, a metal oxinoid compound, and the like as an organic compound, for example.

The electron injection layer 117 is also referred to as a cathode electrode buffer layer, and functions to reduce the energy level difference between the second electrode 104 and the organic EL layer 103, to improve the electron injection efficiency into the organic EL layer 103 from the second electrode 104. Examples of a material of the electron injection layer 117 include inorganic alkaline compounds, such as lithium fluoride (LiF), magnesium fluoride ($MgF_2$), calcium fluoride ($CaF_2$), strontium fluoride ($SrF_2$), and barium fluoride ($BaF_2$), aluminum oxide ($Al_2O_3$), and strontium oxide (SrO).

The second electrode 104 is provided and shared by the plurality of subpixels 5. The second electrode 104 covers the organic EL layer 103 and the edge cover 102, and overlaps with the first electrode 101 with the organic EL layer 103 interposed therebetween. The second electrode 104 functions as a cathode electrode for injecting electrons into the organic EL layer 103, and has optical transparency.

Examples of a material of the second electrode 104 include silver (Ag), aluminum (Al), vanadium (V), cobalt (Co), nickel (Ni), tungsten (W), gold (Au), calcium (Ca), titanium (Ti), yttrium (Y), sodium (Na), ruthenium (Ru), manganese (Mn), indium (In), magnesium (Mg), lithium (Li), ytterbium (Yb), and lithium fluoride (LiF).

The second electrode 104 may be formed of an alloy such as magnesium (Mg)-copper (Cu), magnesium (Mg)-silver (Ag), sodium (Na)-potassium (K), astatine (At)-astatine oxide ($AtO_2$), lithium (Li)-aluminum (Al), lithium (Li)-calcium (Ca)-aluminum (Al), lithium fluoride (LiF)-calcium (Ca)-aluminum (Al) and the like, for example.

The second electrode 104 may be formed of electrically conductive oxide, such as tin oxide (SnO), zinc oxide (ZnO), indium tin oxide (ITO), and indium zinc oxide (IZO), for example. It is further preferable that the second electrode 104 be formed of a material having a small work function to improve the efficiency of electron injection into the organic EL layer 103. The second electrode 104 may be formed by layering a plurality of layers formed of any of the materials described above.

Configuration of Sealing Film

The sealing film 21 is provided so as to cover each of the organic EL elements 105, and has a function of protecting the organic EL layer 103 of each of the organic EL elements 105 from moisture, oxygen, and the like. The sealing film 21 includes a first inorganic layer 125 provided so as to cover the second electrode 104, an organic layer 127 provided on the first inorganic layer 125, and a second inorganic layer 129 provided on the organic layer 127.

The first inorganic layer 125 and the second inorganic layer 129 are formed, for example, from an inorganic material such as silicon oxide ($SiO_2$), aluminum oxide ($Al_2O_3$), silicon nitride (SiNx) like trisilicon tetranitride ($Si_3N_4$), and silicon carbonitride (SiCN). The organic layer 127 is formed of, for example, an organic material such as acrylic resin, polyurea resin, parylene resin, polyimide resin, and polyamide resin.

Configuration of Bending Portion

Figure 7:
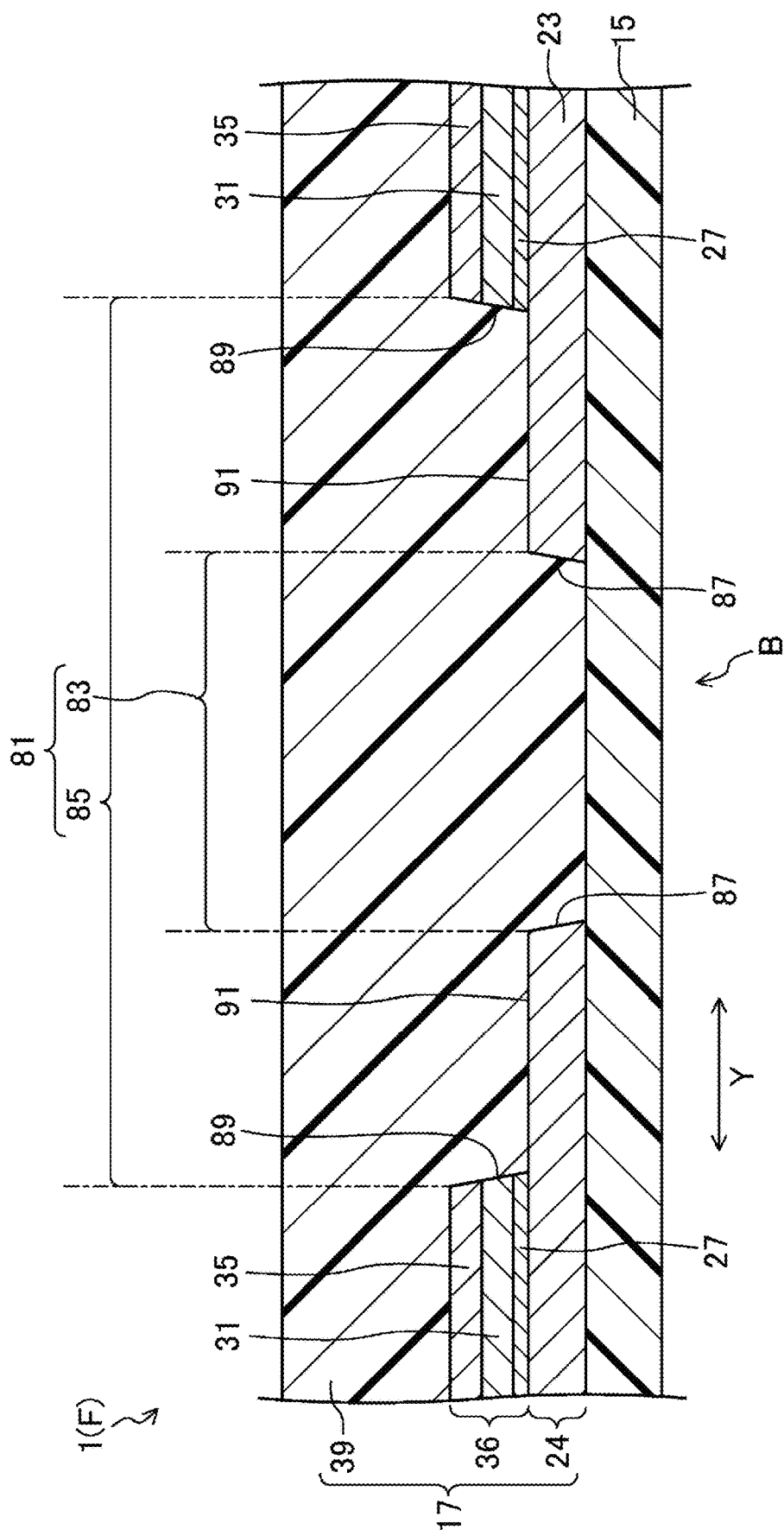
FIG. 7 is a cross-sectional view of the bending portion and the periphery thereof of the organic EL display device taken along the line VII-VII in FIG. 6.
Figure 9:
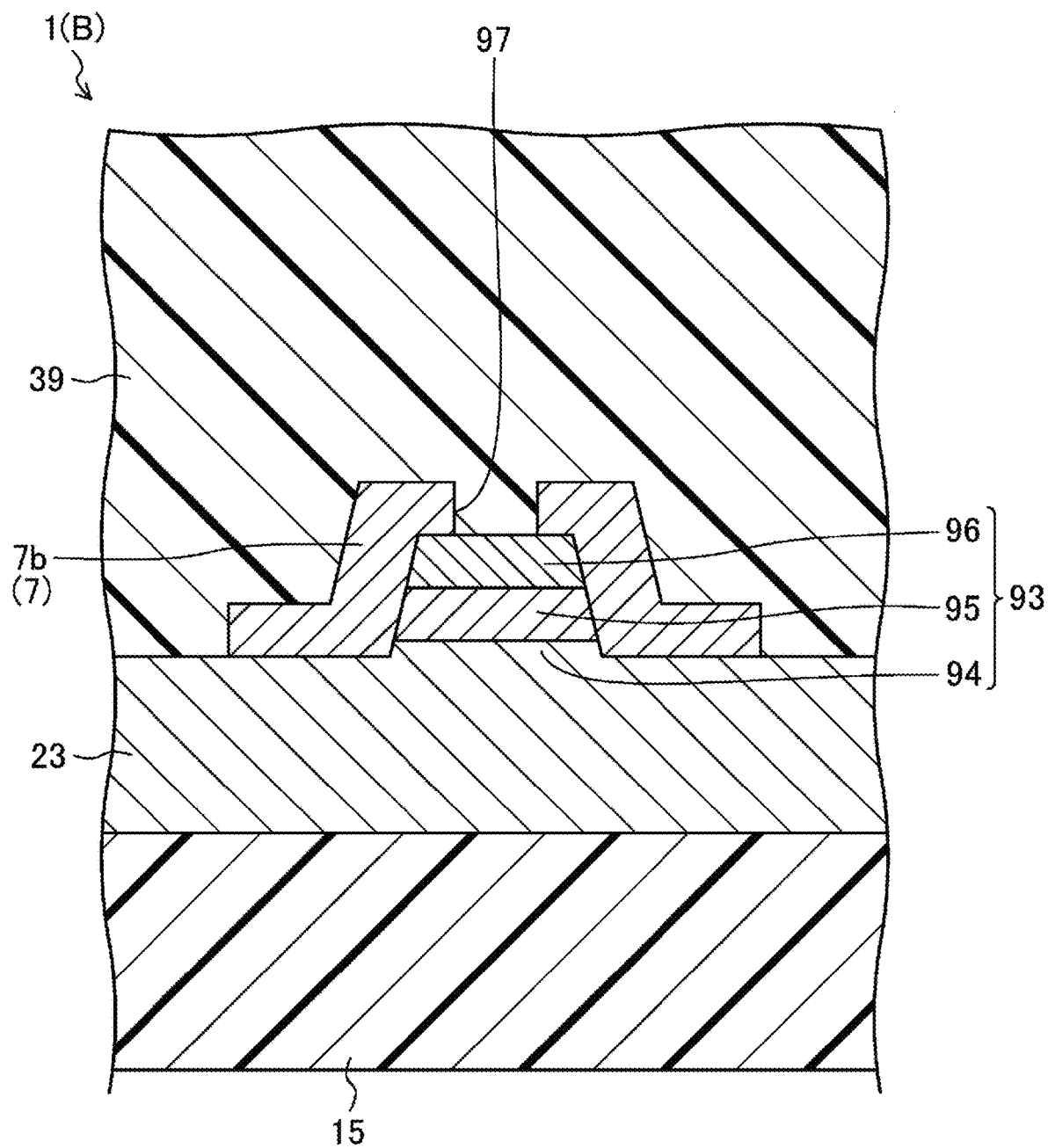
FIG. 9 is a cross-sectional view illustrating main portions of the bending portion of the organic EL display device taken along the line IX-IX in FIG. 6.

FIG. 6 is a plan view illustrating a configuration of the bending portion B and the periphery thereof of the organic EL display device 1 according to the first embodiment. FIG. 7 is a cross-sectional view of the bending portion B and the periphery thereof of the organic EL display device 1 taken along the line VII-VII in FIG. 6. FIG. 8 is a cross-sectional view of the bending portion B and the periphery thereof of the organic EL display device 1 taken along the line VIII-VIII in FIG. 6. FIG. 9 is a cross-sectional view illustrating main portions of the bending portion B of the organic EL display device 1 taken along the line IX-IX in FIG. 6.

In the bending portion B, as illustrated in FIG. 6 to FIG. 8, a slit 81 extending in the first direction X is provided in the TFT layer 17. The slit 81 is constituted with a first slit 83 formed in the base coat layer 23 (the first inorganic insulating film 24), and a second slit 85 formed in the gate insulating layer 27, the first interlayer insulating layer 31, and the second interlayer insulating layer 35 (the second inorganic insulating film 36) with a width wider than that of the first slit 83. The first slit 83 is formed in the middle of the second slit 85 in the width direction, and exposes the surface of the resin substrate layer 15 from the base coat layer 23.

The slit 81 forms a first step 87 between the surface of the base coat layer 23 and the surface of the resin substrate layer 15 in the bending portion B, and forms a second step 89 between the surface of the second interlayer insulating layer 35 and the surface of the base coat layer 23. Then, the portions of the base coat layer 23 on both sides in the width direction of the first slit 83 constitute step portions 91 exposed from the gate insulating layer 27, the first interlayer insulating layer 31, and the second interlayer insulating layer 35 inside the second slit 85. Each of the step portion 91 is located in the slit 81 between the first step 87 and the second step 89.

The thickness of the layered structure on the resin substrate layer 15 at the bending portion B and the periphery thereof is changed in three stages at the outer side of the slit 81, the step portion 91 in the slit 81, and the exposed portion of the resin substrate layer 15 between the two step portions 91, and gradually decreases from the outer side toward the inner side in the width direction of the slit 81. In this way, the difference in height between the surface of the second interlayer insulating layer 35 and the surface of the resin substrate layer 15 is divided into two steps 87 and 89, and the steps 87 and 89 are made smaller, making it difficult to break the lead-out wiring line 7 (first lead-out wiring line 7a) at a step that can be formed by the formation of the slits 81.

As illustrated in FIG. 8 and FIG. 9, the step portions 91 in the slit 81 are provided with protruding portions 93 each having a rectangular island shape. At locations in the slit 81 where the lead-out wiring line 7 in the step portion 91 extends, a plurality of protruding portions 93 (three in each location in the illustrated example) are provided, and are aligned in the second direction Y. The plurality of protruding portions 93 are arranged in a matrix as a whole at intervals from each other in the step portion 91 within the slit 81.

The protruding portion 93 is constituted with a protruding base portion 94 provided on the surface of the base coat layer 23, an insulating layer 95 provided on the base portion 94, and a conductive layer 96 provided on the insulating layer 95. The insulating layer 95 is formed by the same material in the same layer as the gate insulating layer 27. The conductive layer 96 is formed by the same material in the same layer as the gate wiring line 43 and the emission control wiring line 47. The conductive layer 96 is included in the gate conductive layer 29.

The lead-out wiring line 7 includes a first lead-out wiring line 7a provided on the gate insulating layer 27 and a second lead-out wiring line 7b provided on the second interlayer insulating layer 35.

The first lead-out wiring line 7a is provided on both sides of the display region D side and the terminal portion T side in the width direction of the slit 81. The first lead-out wiring line 7a is covered by the first interlayer insulating layer 31 and the second interlayer insulating layer 35. In other words, the first lead-out wiring line 7a is provided between the gate insulating layer 27 and the first interlayer insulating layer 31.

The second lead-out wiring line 7b extends through the first step 87, the step portion 91, and the second step 89 from one side to the other side of the slit 81 in the second direction Y, and traverses the slit 81. The second lead-out wiring line 7b is covered by a flattened layer 39. The second lead-out wiring line 7b is connected to the first lead-out wiring line 7a via the contact hole 72 formed in the first interlayer insulating layer 31 and the second interlayer insulating layer 35 on both sides in the width direction of the slit 81.

Furthermore, the second lead-out wiring line 7b includes an opening 97 that covers the perimeter edge surfaces of the plurality of protruding portions 93 aligned in the second direction Y at the step portion 91 in the slit 81, and exposes the upper faces of the protruding portions 93. The second lead-out wiring line 7b is in contact with the conductive layer 96 that constitutes the protruding portion 93. The second lead-out wiring line 7b extends on the surface of the resin substrate layer 15 inside the first slit 83 and is in contact with the resin substrate layer 15. The second lead-out wiring line 7b includes a plurality (five in the illustrated example) of openings 98 that expose the resin substrate layer 15. In this way, the second lead-out wiring line 7b is formed in a chain shape such that a plurality of ring shapes are bundled together.

Method for Manufacturing Organic EL Display Device

A method for manufacturing the organic EL display device 1 having the configuration described above will be described below with reference to FIG. 10 to FIG. 17.

Figure 10:
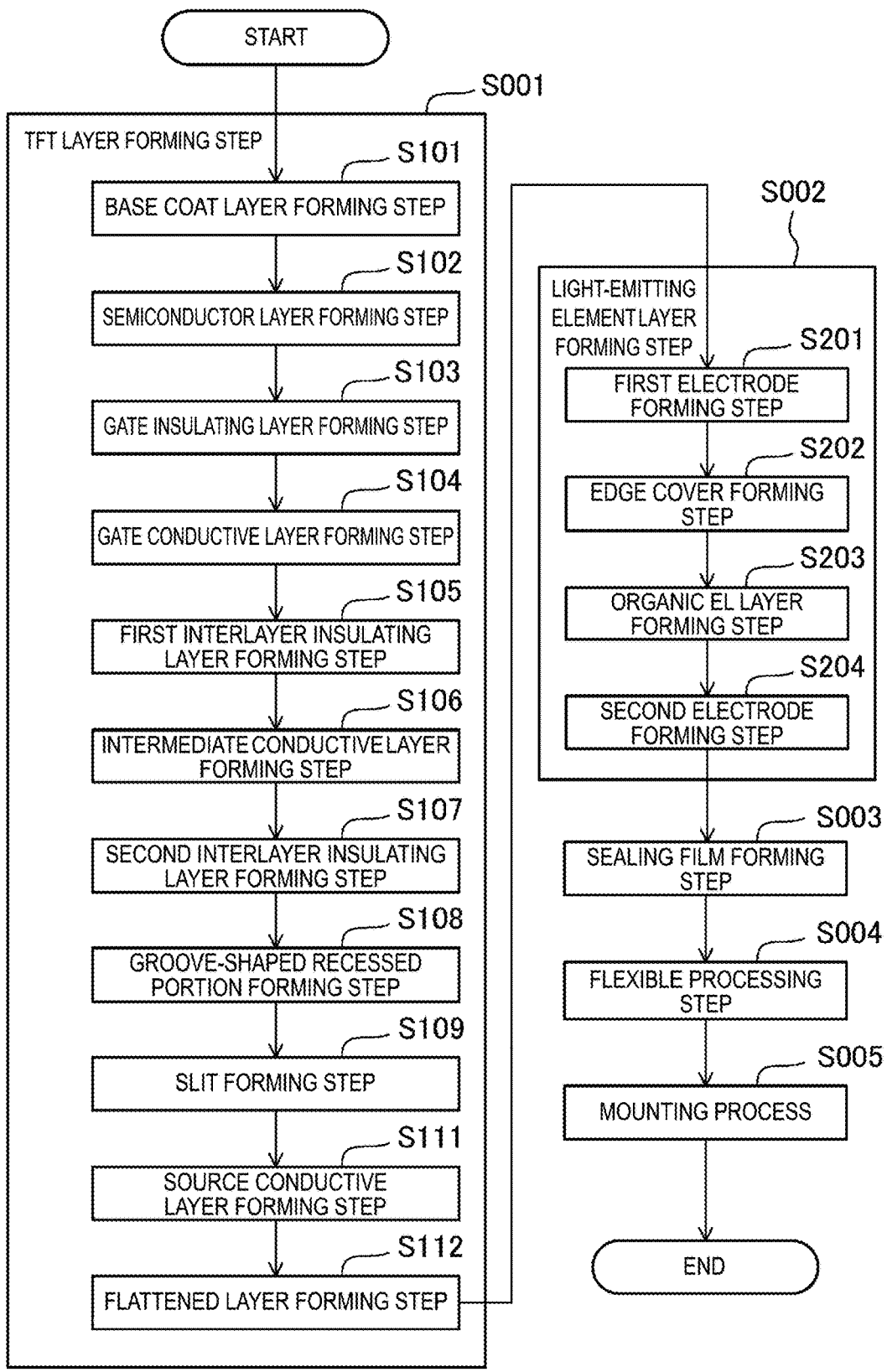
FIG. 10 is a schematic flowchart of a method for manufacturing the organic EL display device according to the first embodiment.
Figure 11:
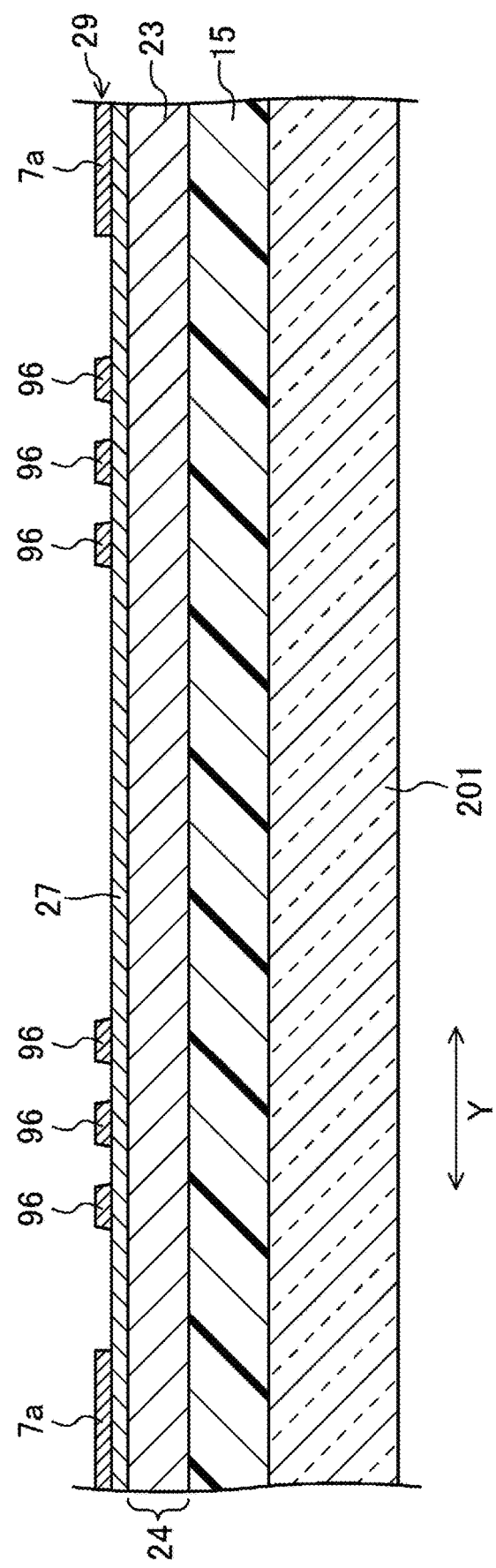
FIG. 11 is a cross-sectional view of a position corresponding to FIG. 8 illustrating a state in which a gate conductive layer is formed in the manufacturing of the organic EL display device according to the first embodiment.
Figure 12:
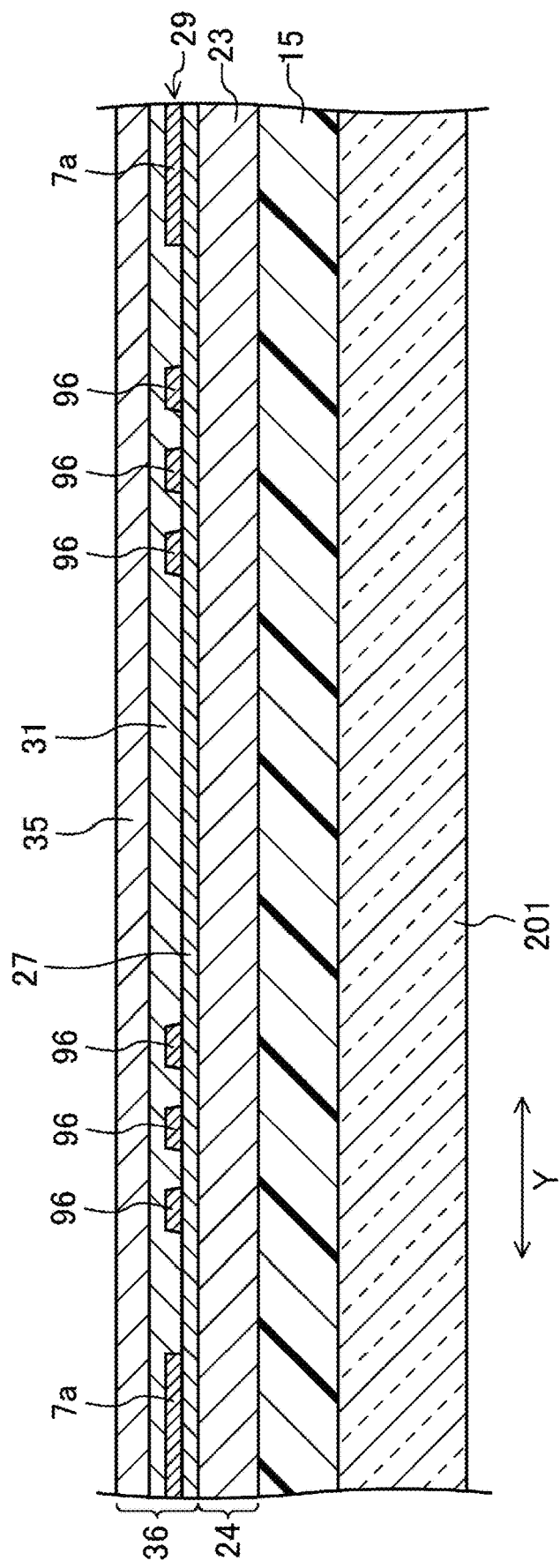
FIG. 12 is a cross-sectional view of a position corresponding to FIG. 8 illustrating a state in which a second interlayer insulating layer is formed in the manufacturing of the organic EL display device according to the first embodiment.
Figure 13:
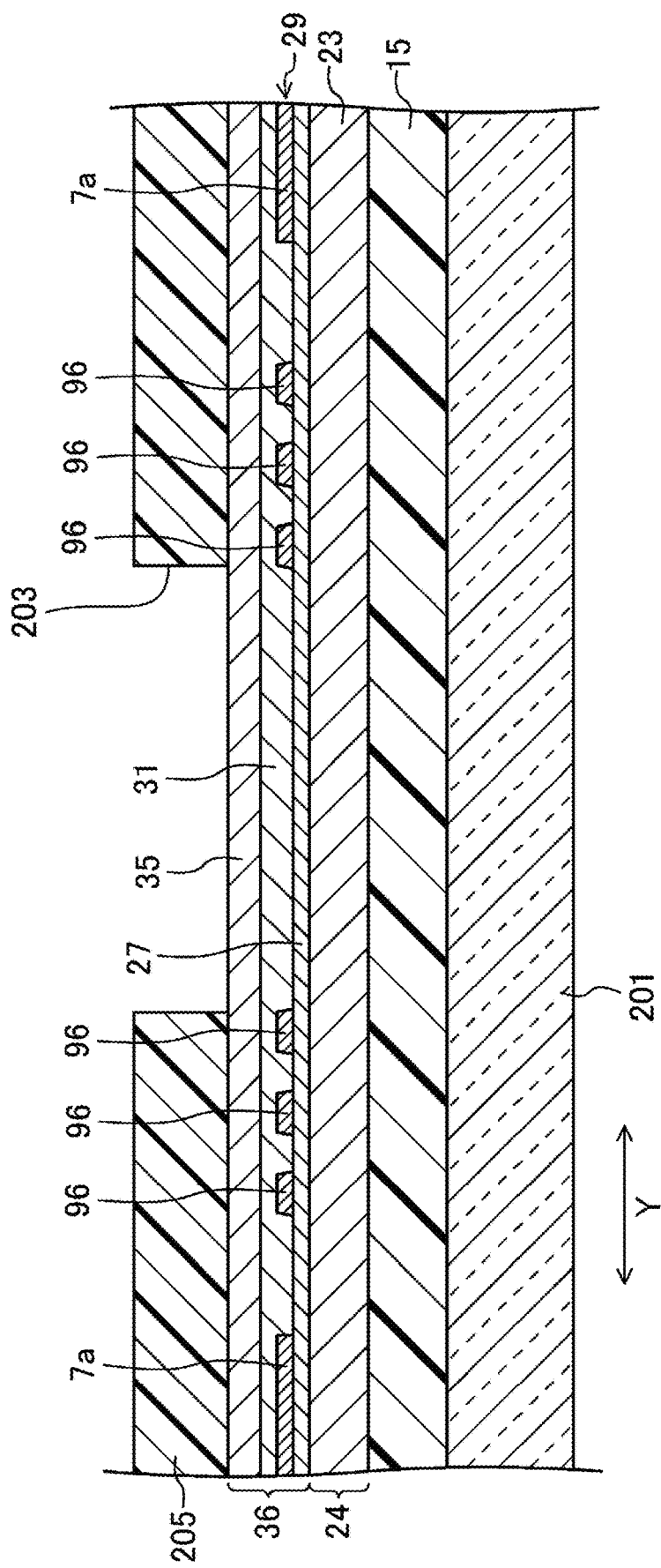
FIG. 13 is a cross-sectional view of a position corresponding to FIG. 8 illustrating a state when forming a groove-shaped recessed portion in the manufacturing of the organic EL display device according to the first embodiment.

FIG. 10 is a schematic flowchart of a method for manufacturing the organic EL display device 1 according to the first embodiment. FIG. 11 is a cross-sectional view of a position corresponding to FIG. 8 illustrating a state in which the gate conductive layer 29 is formed in the manufacturing of the organic EL display device 1 according to the first embodiment. FIG. 12 is a cross-sectional view of a position corresponding to FIG. 8 illustrating a state in which the second interlayer insulating layer 35 is formed in the manufacturing of the organic EL display device 1 according to the first embodiment. FIG. 13 is a cross-sectional view of a position corresponding to FIG. 8 illustrating a state when forming the groove-shaped recessed portion 99 in the manufacturing of the organic EL display device 1 according to the first embodiment.

Figure 14:
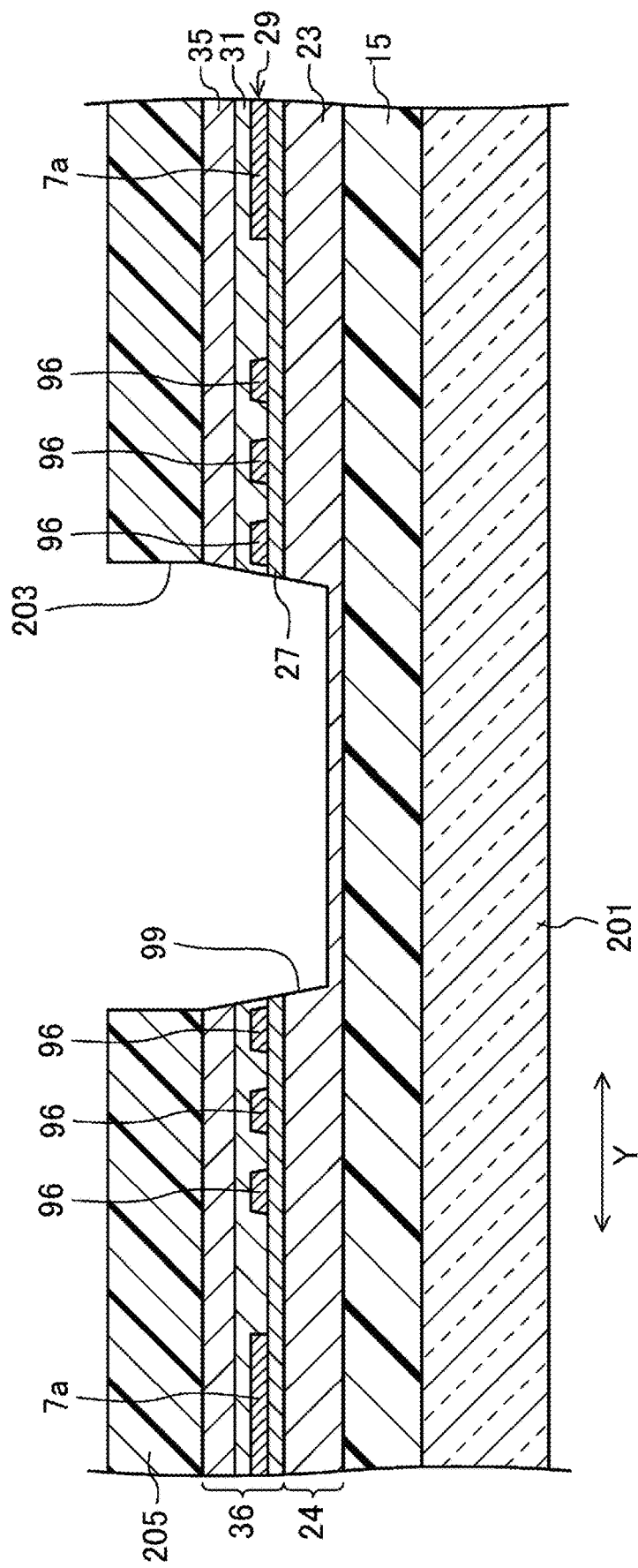
FIG. 14 is a cross-sectional view of a position corresponding to FIG. 8 illustrating a state in which the groove-shaped recessed portion is formed in the manufacturing of the organic EL display device according to the first embodiment.
Figure 15:
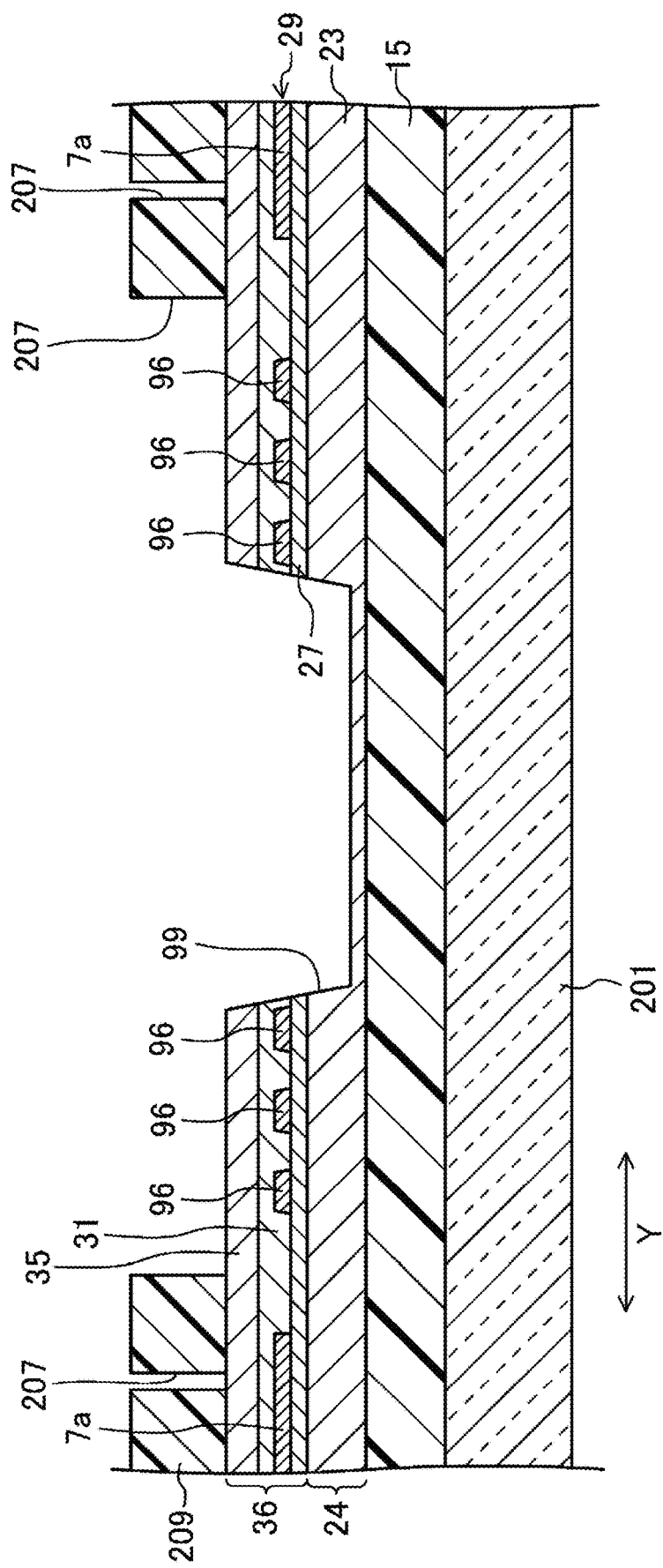
FIG. 15 is a cross-sectional view of a position corresponding to FIG. 8 illustrating a state when forming a slit in the manufacturing of the organic EL display device according to the first embodiment.
Figure 16:
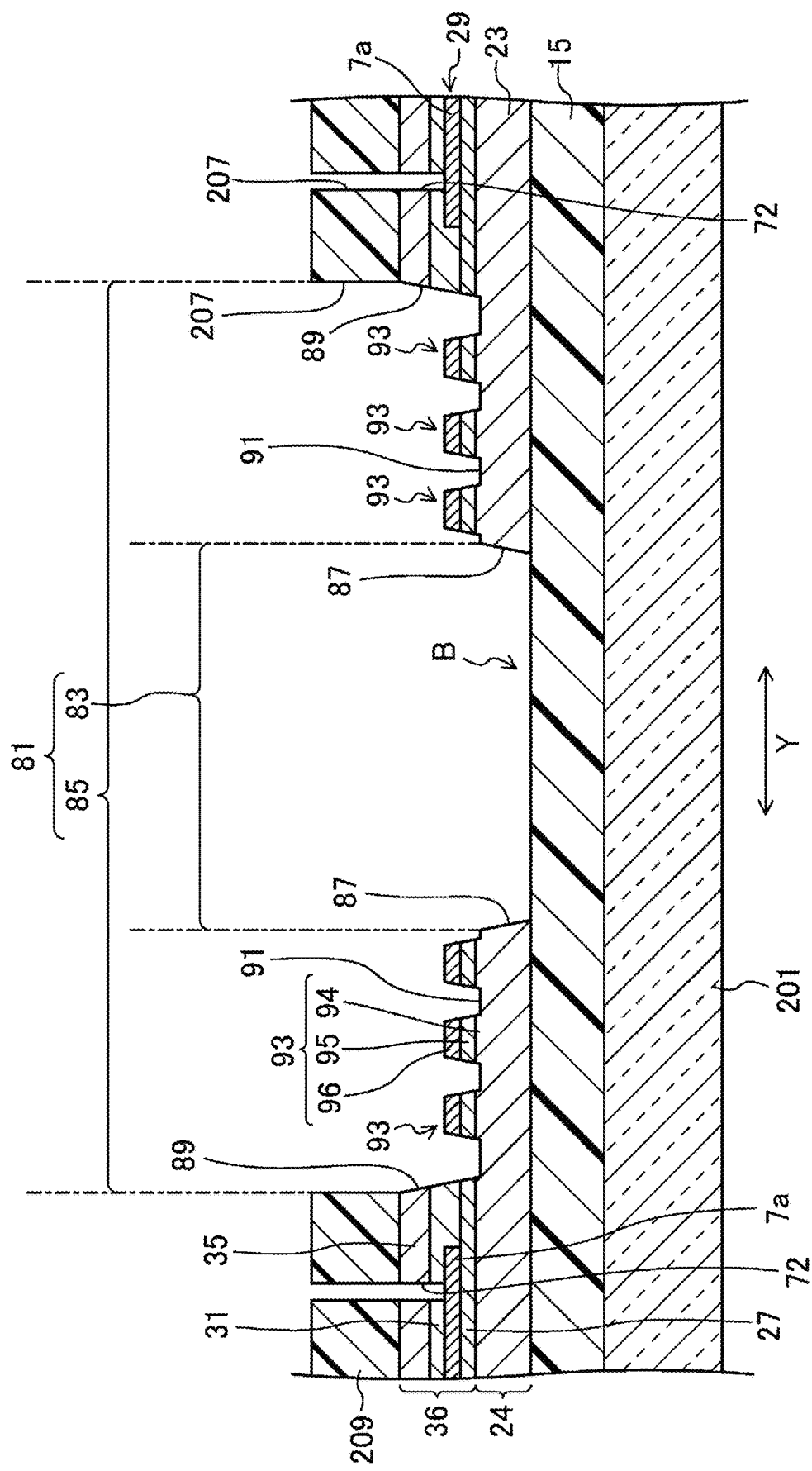
FIG. 16 is a cross-sectional view of a position corresponding to FIG. 8 illustrating a state in which the slit is formed in the manufacturing of the organic EL display device according to the first embodiment.
Figure 17:
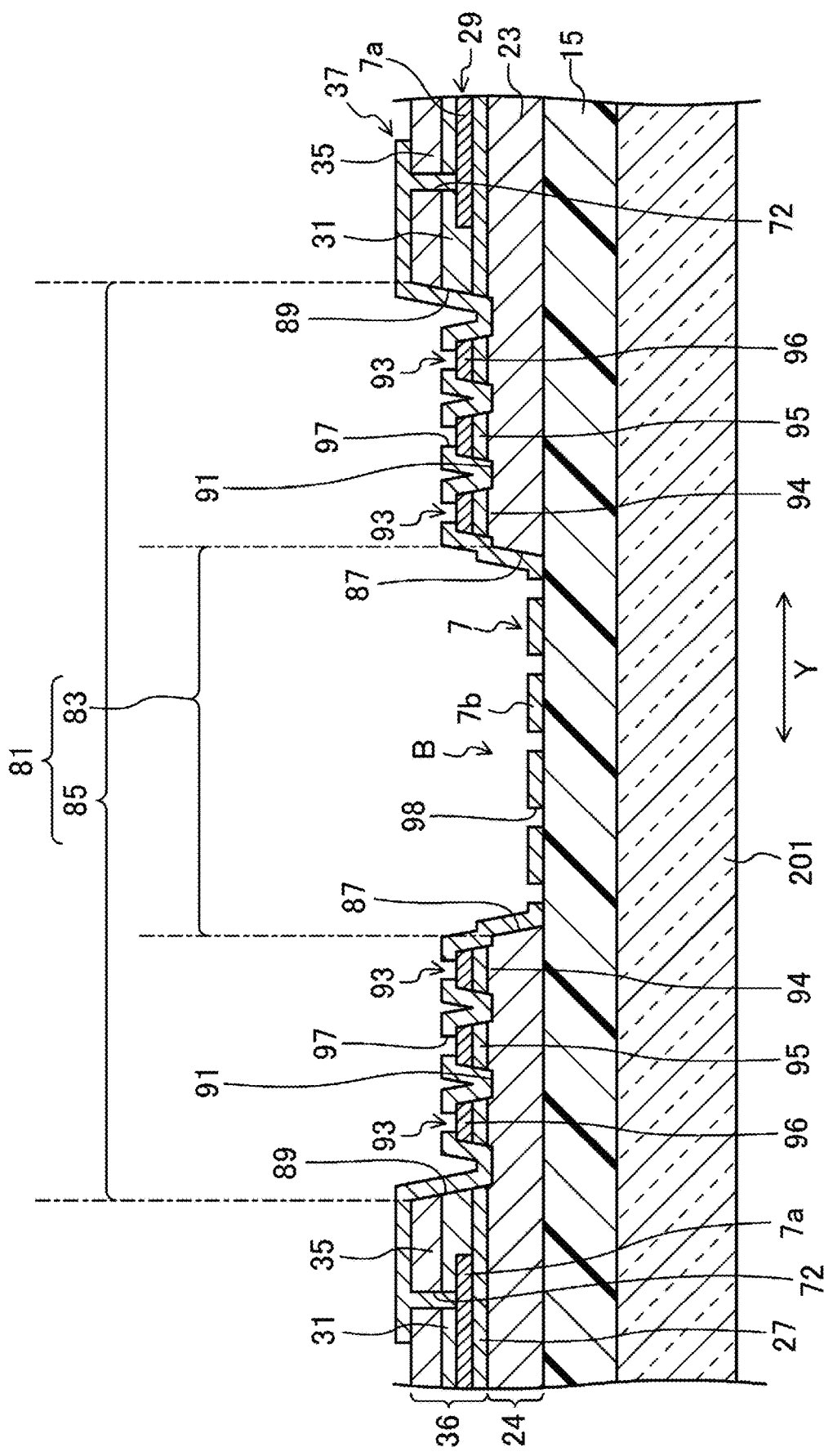
FIG. 17 is a cross-sectional view of a position corresponding to FIG. 8 illustrating a state in which a source conductive layer is formed in the manufacturing of the organic EL display device according to the first embodiment.

FIG. 14 is a cross-sectional view of a position corresponding to FIG. 8 illustrating a state in which the groove-shaped recessed portion 99 is formed in the manufacturing of the organic EL display device 1 according to the first embodiment. FIG. 15 is a cross-sectional view of a position corresponding to FIG. 8 illustrating a state when forming the slit 81 in the manufacturing of the organic EL display device 1 according to the first embodiment. FIG. 16 is a cross-sectional view of a position corresponding to FIG. 8 illustrating a state in which the slit 81 is formed in the manufacturing of the organic EL display device 1 according to the first embodiment. FIG. 17 is a cross-sectional view of a position corresponding to FIG. 8 illustrating a state in which the source conductive layer 37 is formed in the manufacturing of the organic EL display device 1 according to the first embodiment.

As illustrated in FIG. 10, the method for manufacturing the organic EL display device 1 includes a TFT layer forming step S001, a light-emitting element layer forming step S002, a sealing film forming step S003, a flexible processing step S004, and a mounting process S005.

TFT Layer Forming Step

The TFT layer forming step S001 includes a base coat layer forming step S101, a semiconductor layer forming step S102, a gate insulating layer forming step S103, a gate conductive layer forming step S104, a first interlayer insulating layer forming step S105, an intermediate conductive layer forming step S106, a second interlayer insulating layer forming step S107, a groove-shaped recessed portion forming step S108, a slit forming step S109, a source conductive layer forming step S111, and a flattened layer forming step S112.

In the TFT layer forming step S001, the base coat layer forming step S101, the gate insulating layer forming step S103, the first interlayer insulating layer forming step S105, and the second interlayer insulating layer forming step S107 correspond to the inorganic insulating film forming step. The gate conductive layer forming step S104 corresponds to the first wiring line forming step. The intermediate conductive layer forming step S106 corresponds to the second wiring line forming step. The source conductive layer forming step S111 corresponds to the third wiring line forming step and the lead-out wiring line forming step.

In the TFT layer forming step S001, first, a substrate in which the resin substrate layer 15 is formed on a glass substrate 201 is prepared. In the base coat layer forming step S101, an inorganic insulating film is formed as a single layer or so as to be laminated on the resin substrate layer 15 of the prepared substrate by, for example, a Chemical Vapor Deposition (CVD) method to form the base coat layer 23.

In the semiconductor layer forming step S102 to be performed next, a semiconductor film is formed on the substrate on which the base coat layer 23 is formed, for example, by a CVD method, and after the semiconductor film is crystallized or reduced in resistance as necessary, the semiconductor film is patterned by photolithography to form the semiconductor layer 25.

In the gate insulating layer forming step S103 to be performed next, an inorganic insulating film is formed as a single layer or so as to be laminated on the substrate on which the semiconductor layer 25 is formed, for example, by a Chemical Vapor Deposition (CVD) method to form the gate insulating layer 27.

In the gate conductive layer forming step S104 to be performed next, a metal film is formed as a single layer or so as to be laminated on the substrate on which the gate insulating layer 27 is formed, for example, by a sputtering method to form a conductive film. Subsequently, the conductive film is patterned by photolithography to form the gate conductive layer 29 (the gate wiring line 43, the gate electrode 45, the emission control wiring line 47, the first capacitance electrode 49, the first lead-out wiring line 7a, and the conductive layer 96) as illustrated in FIG. 11.

In the first interlayer insulating layer forming step S105 to be performed next, an inorganic insulating film is formed as a single layer or so as to be laminated on the substrate on which the gate conductive layer 29 is formed, for example, by a CVD method to form the first interlayer insulating layer 31.

In the intermediate conductive layer forming step S106 to be performed next, a metal film is formed as a single layer or so as to be laminated on the substrate on which the first interlayer insulating layer 31 is formed, for example, by a sputtering method to form a conductive film. Subsequently, the conductive film is patterned by photolithography to form the intermediate conductive layer 33 (the initialization power source wiring line 53 and the second capacitance electrode 55).

In the second interlayer insulating layer forming step S107 to be performed next, an inorganic insulating film is formed as a single layer or so as to be laminated on the substrate on which the intermediate conductive layer 33 is formed, for example, by a CVD method to form the second interlayer insulating layer 35, as illustrated in FIG. 12.

In the groove-shaped recessed portion forming step S108 to be performed next, a photosensitive resin material is applied to the substrate on which the second interlayer insulating layer 35 is formed, for example, by a publicly known coating method such as a spin coating method. Subsequently, the applying film of the photosensitive resin material is pre-baked, exposed, developed, and post-baked to pattern the applying film to form a first resist layer 205 including an opening 203 at a location where the first slit 83 is to be formed as illustrated in FIG. 13.

Then, the base coat layer 23, the gate insulating layer 27, the first interlayer insulating layer 31, and the second interlayer insulating layer 35 are etched using the first resist layer 205 as a mask to form a groove-shaped recessed portion 99 forming a recessed portion in the base coat layer 23 so as to penetrate the gate insulating layer 27, the first interlayer insulating layer 31, and the second interlayer insulating layer 35 as illustrated in FIG. 14. Thereafter, the first resist layer 205 is removed from the second interlayer insulating layer 35 by ashing.

In the slit forming step S109 to be performed next, a photosensitive resin material is applied to the substrate from which the first resist layer 205 is removed, for example, by a publicly known coating method such as a spin coating method. Subsequently, the applying film of the photosensitive resin material is pre-baked, exposed, developed, and post-baked to pattern the applying film to form a second resist layer 209 including an opening 207 at each location where the contact hole 71 and 72 and the second slit 85 are to be formed, as illustrated in FIG. 15.

Then, the base coat layer 23, the gate insulating layer 27, the first interlayer insulating layer 31, and the second interlayer insulating layer 35 are etched using the second resist layer 209 as a mask to form the second slit 85, and a portion of the base coat layer 23 that forms the bottom of the groove-shaped recessed portion 99 is removed to form the first slit 83 as illustrated in FIG. 16. As a result, the slit 81 is configured that extends in the first direction X in the bending portion B and includes the step portions 91 on both sides of the first slit 83 inside the second slit 85. At this time, the gate insulating layer 27 and a portion of the base coat layer 23 are etched using the conductive layer 96 as a mask in the step portion 91 within the slit 81 to form the insulating layer 95 and the base portion 94 to form an island-shaped protruding portion 93. Thereafter, the second resist layer 209 is removed from the second interlayer insulating layer 35 by ashing.

In the source conductive layer forming step S111 to be performed next, a metal film is formed as a single layer or so as to be laminated on the substrate on which the slit 81 is formed, for example, by a sputtering method to form a conductive film. Subsequently, the conductive film is patterned by photolithography to form the source conductive layer 37 (the source wiring line 59, the source electrode 61, the drain electrode 63, the high-level power source wiring line 65, the low-level power source wiring line, and the second lead-out wiring line 7b) as illustrated in FIG. 17. At this time, the second lead-out wiring line 7b is formed in a manner extending from one side to the other side of the slit 81 in the second direction Y through the step portion 91, in a chain shape including a plurality of openings 97 covering the perimeter edge surfaces of the protruding portion 93 and exposing the upper face of the protruding portion 93 and a plurality of openings 98 exposing the surface of the resin substrate layer 15 in the first slit 83.

In the flattened layer forming step S112 to be performed next, a photosensitive resin material is applied to the substrate on which the source conductive layer 37 is formed, for example, by a publicly known coating method such as a spin coating method. Subsequently, the applying film of the photosensitive resin material is pre-baked, exposed, developed, and post-baked to pattern the applying film to form the flattened layer 39.

In this way, in the TFT layer forming step S001, the TFT layer 17 is formed on the resin substrate layer 15.

Light-Emitting Element Layer Forming Step

The light-emitting element layer forming step S002 includes a first electrode forming step S201, an edge cover forming step S202, an organic EL layer forming step S203, and a second electrode forming step S204.

In the first electrode forming step S201, a conductive oxide film or a metal film is formed on the substrate on which the TFT layer 17 is formed, for example, by a sputtering method, to form a conductive film. Subsequently, the conductive film is patterned by photolithography to form the first electrode 101.

In the edge cover forming step S202 to be performed next, a photosensitive resin material is applied to the substrate on which the first electrode 101 is formed, for example, by a publicly known coating method such as a spin coating method. Subsequently, the applying film of the photosensitive resin material is pre-baked, exposed, developed, and post-baked to pattern the applying film to form the edge cover 102.

In the organic EL layer forming step S203 to be performed next, the hole injection layer 109, the hole transport layer 111, the light-emitting layer 113, the electron transport layer 115, and the electron injection layer 117 are formed in that order on the substrate on which the edge cover 102 is formed, for example, by a vacuum vapor deposition technique using a film forming mask referred to as a Fine Metal Mask (FMM) which is capable of patterning in units of subpixels, to form the organic EL layer 103 on the individual first electrode 101.

Note that in the organic EL layer forming step S203, some layers of the hole injection layer 109, the hole transport layer 111, the light-emitting layer 113, the electron transport layer 115, and the electron injection layer 117 may be formed by using a film forming mask referred to as a Common Metal Mask (CMM) which is capable of patterning in units of display panels.

In the second electrode forming step S204 to be performed next, a metal film is formed as a single layer or so as to be laminated on the substrate on which the organic EL layer 103 is formed, for example, by a vacuum vapor deposition technique using a CMM film forming mask, to form the second electrode 104.

In this way, in the light-emitting element layer forming step S002, the light-emitting element layer 19 including the plurality of organic EL elements 105 is formed on the TFT layer 17.

Sealing Film Forming Step

In the sealing film forming step S003, an inorganic insulating film is formed as a single layer or so as to be laminated on the substrate on which the light-emitting element layer 19 is formed, for example, by a CVD method using a CMM film forming mask, to form the first inorganic layer 125.

Subsequently, an organic material is applied to the substrate on which the first inorganic layer 125 is formed, for example, by an ink-jet method, to form the organic layer 127.

Then, an inorganic insulating layer is formed as a single layer or so as to be laminated on the substrate on which the organic layer 127 is formed, for example, by a CVD method using a CMM film forming mask, to form the second inorganic layer 129.

In this way, in the sealing film forming step S003, the sealing film 21 is formed by laminating the first inorganic layer 125, the organic layer 127, and the second inorganic layer 129.

Flexible Processing Step

In the flexible processing step S004, first, a surface protection film is bonded to the surface of the substrate on which the sealing film 21 is formed. Next, the glass substrate 201 is peeled off from the lower face of the resin substrate layer 15 by irradiating the lower face of the resin substrate layer 15 with laser light from the glass substrate 201 side. Then, a rear face protection film is applied to the lower face of the resin substrate layer 15 from which the glass substrate 201 has been peeled off.

Mounting Process

In the mounting process S005, a wiring line substrate is connected to the terminal portion T of the substrate on which the glass substrate 201 is peeled off from the resin substrate layer 15 by using a conductive material such as Anisotropic Conductive Film (ACF) or an Anisotropic Conductive Paste (ACP), and thus the display control circuit and the like are mounted together with the wiring line substrate by making the wiring line substrate conductive with the wiring terminal 7.

As described above, the organic EL display device 1 according to the first embodiment can be manufactured.

According to the organic EL display device 1 according to the first embodiment, the protruding portion 93 is provided in the step portion 91 within the slit 81 provided in the bending portion B, and the lead-out wiring line 7 traversing the slit 81 is provided in a manner including an opening 97 that covers the perimeter edge surfaces of the protruding portion 93 and exposes the upper face of the protruding portion 93. Thus, the adhesion of the lead-out wiring line 7 in the step portion 91 can be improved, and stress concentration at a specific portion of the lead-out wiring line 7 can be alleviated even when the lead-out wiring line 7 is pulled on both sides due to stress generated in the wiring portion formed in the first step 87 and the second step 89. As a result, it is possible to prevent the lead-out wiring line 7 from being broken or peeled off at the bending portion B of the organic EL display device 1.

Second Embodiment

An organic EL display device 1 according to a second embodiment differs from that of the first embodiment in the configuration of the bending portion B. Note that in the second embodiment, the organic EL display device 1 is configured in a similar manner to the first embodiment described above except that the configuration of the bending portion B is different from the first embodiment described above, and thus, only the bending portion B having the different configuration is described, the same configuration is to be referred to the description in the first embodiment described above based on FIG. 1 to FIG. 17, and detailed descriptions thereof will be omitted.

Figure 18:
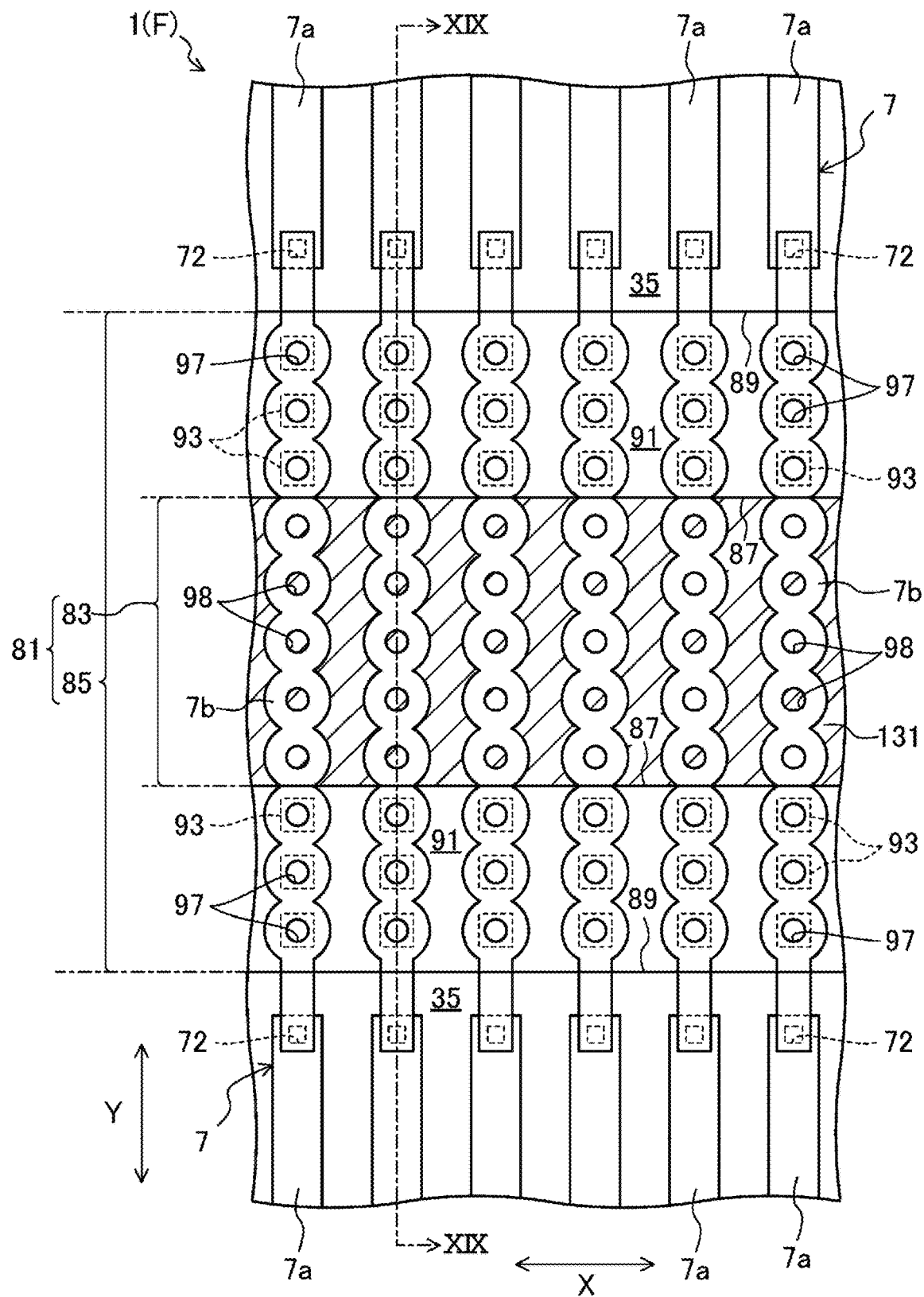
FIG. 18 is a plan view illustrating a configuration of the bending portion and the periphery thereof of the organic EL display device according to a second embodiment.
Figure 19:
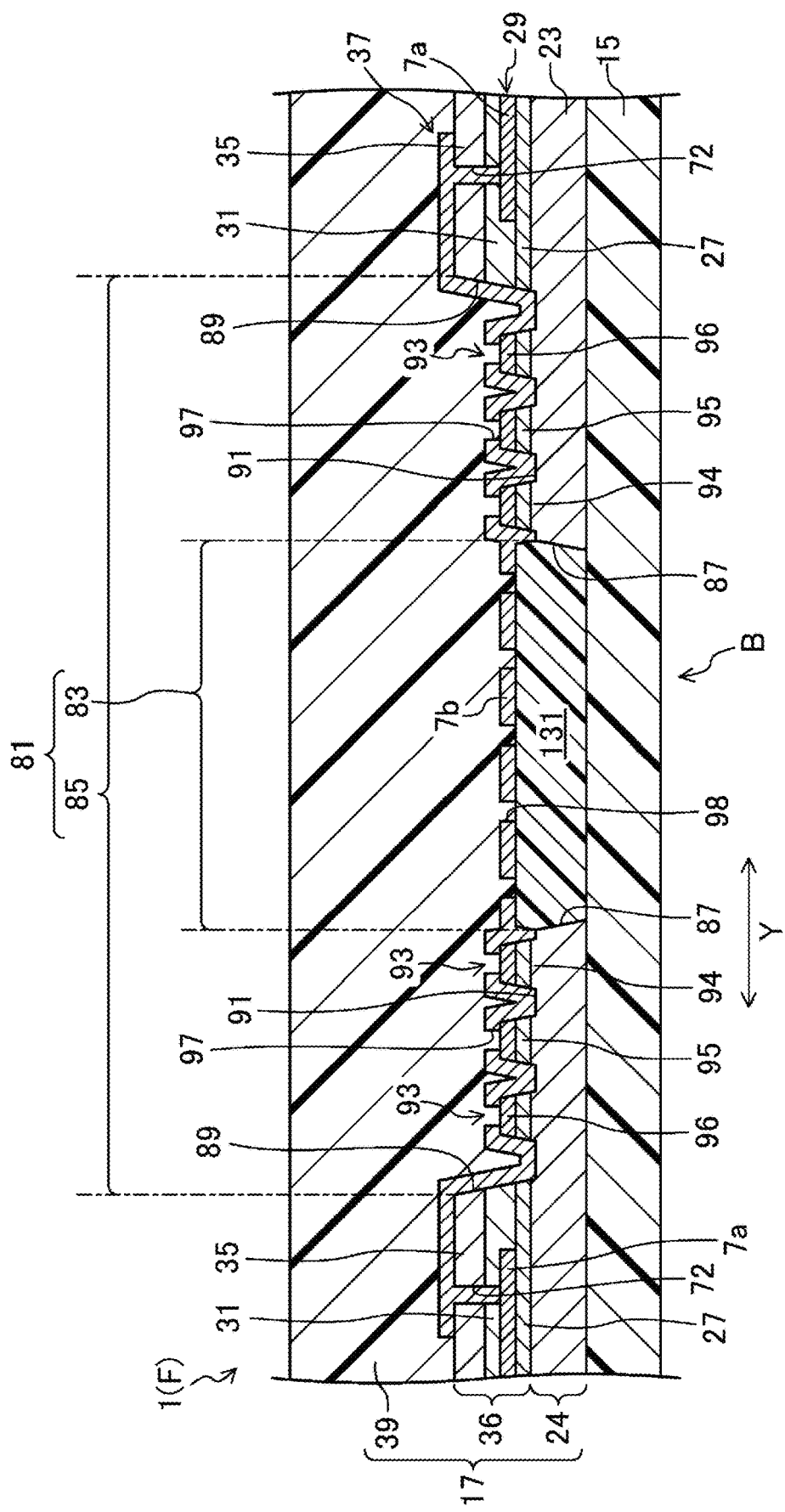
FIG. 19 is a cross-sectional view of the bending portion and the periphery thereof of the organic EL display device taken along the line XIX-XIX in FIG. 18.

FIG. 18 is a plan view illustrating a configuration of the bending portion B and the periphery thereof of the organic EL display device 1 according to the second embodiment. FIG. 19 is a cross-sectional view of the bending portion B and the periphery thereof of the organic EL display device 1 taken along the line XIX-XIX in FIG. 18. In the organic EL display device 1 according to the second embodiment, as illustrated in FIG. 18 and FIG. 19, a buried layer 131 (hatched portion in FIG. 18) that landfills the first slit 83 is provided in the slit 81 of the bending portion B. The buried layer 131 is formed of an organic material such as a photosensitive polyimide resin.

Furthermore, the second lead-out wiring line 7b that constitutes the lead-out wiring line 7 extends in the slit 81 from one side to the other side of the first slit 83 in the second direction Y on the surface of the buried layer 131. The second lead-out wiring line 7b includes a plurality (five in the example illustrated) of openings 133 that expose the buried layer 131 at a location corresponding to the first slit 83, that is, a portion extending on the surface of the buried layer 131, and is formed in a chain shape such that a plurality of ring shapes are bundled together, similar to the first embodiment described above.

Figure 20:
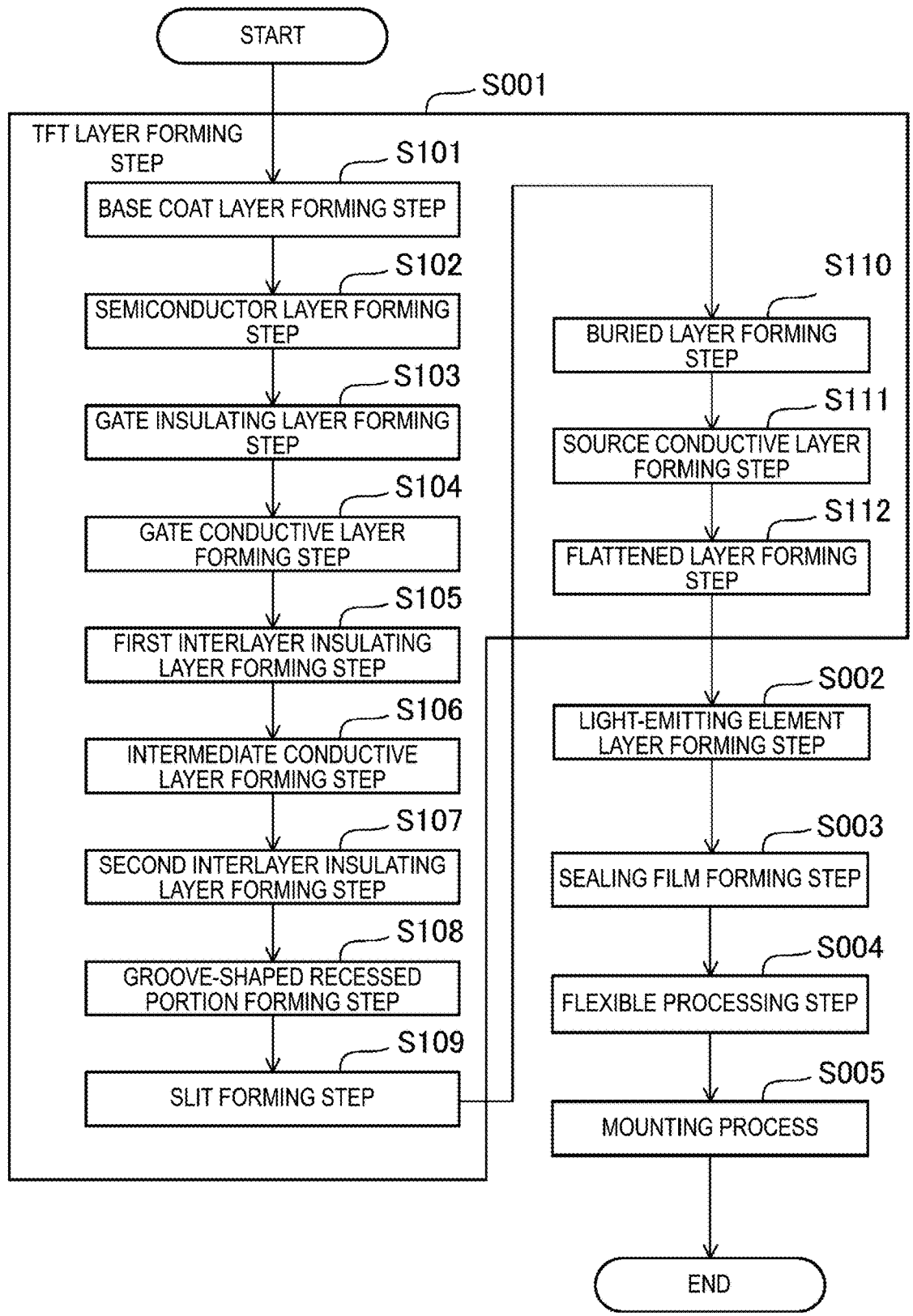
FIG. 20 is a schematic flowchart of a method for manufacturing the organic EL display device according to the second embodiment.

FIG. 20 is a schematic flowchart of a method for manufacturing the organic EL display device 1 according to the second embodiment. As illustrated in FIG. 20, the method for manufacturing the organic EL display device 1 having the configuration described above includes a TFT layer forming step S001, a light-emitting element layer forming step S002, a sealing film forming step S003, a flexible processing step S004, and a mounting process S005. The light-emitting element layer forming step S002, the sealing film forming step S003, the flexible processing step S004, and the mounting process S005 are the same as those of the first embodiment described above.

The TFT layer forming step S001 includes a base coat layer forming step S101, a semiconductor layer forming step S102, a gate insulating layer forming step S103, a gate conductive layer forming step S104, a first interlayer insulating layer forming step S105, an intermediate conductive layer forming step S106, a second interlayer insulating layer forming step S107, a groove-shaped recessed portion forming step S108, a slit forming step S109, a buried layer forming step S110, a source conductive layer forming step S111, and a flattened layer forming step S112.

Steps other than the buried layer forming step S110 in the TFT layer forming step S001 (the base coat layer forming step S101, the semiconductor layer forming step S102, the gate insulating layer forming step S103, the gate conductive layer forming step S104, the first interlayer insulating layer forming step S105, the intermediate conductive layer forming step S106, the second interlayer insulating layer forming step S107, the groove-shaped recessed portion forming step S108, the slit forming step S109, the source conductive layer forming step S111, and the flattened layer forming step S112) are the same as those of the first embodiment.

In the buried layer forming step S110 that is performed after the slit forming step S109, a photosensitive resin material is applied to the substrate on which the slit 81 is formed in the TFT layer 17, for example, by a publicly known coating method such as a spin coating method. Subsequently, the applying film of the photosensitive resin material is pre-baked, exposed, developed, and post-baked to pattern the applying film to form the buried layer 131. Thereafter, the source conductive layer forming step S111 and the flattened layer forming step S112 are performed sequentially.

As described above, the organic EL display device 1 according to the second embodiment can be manufactured.

First Modification Example

Figure 21:
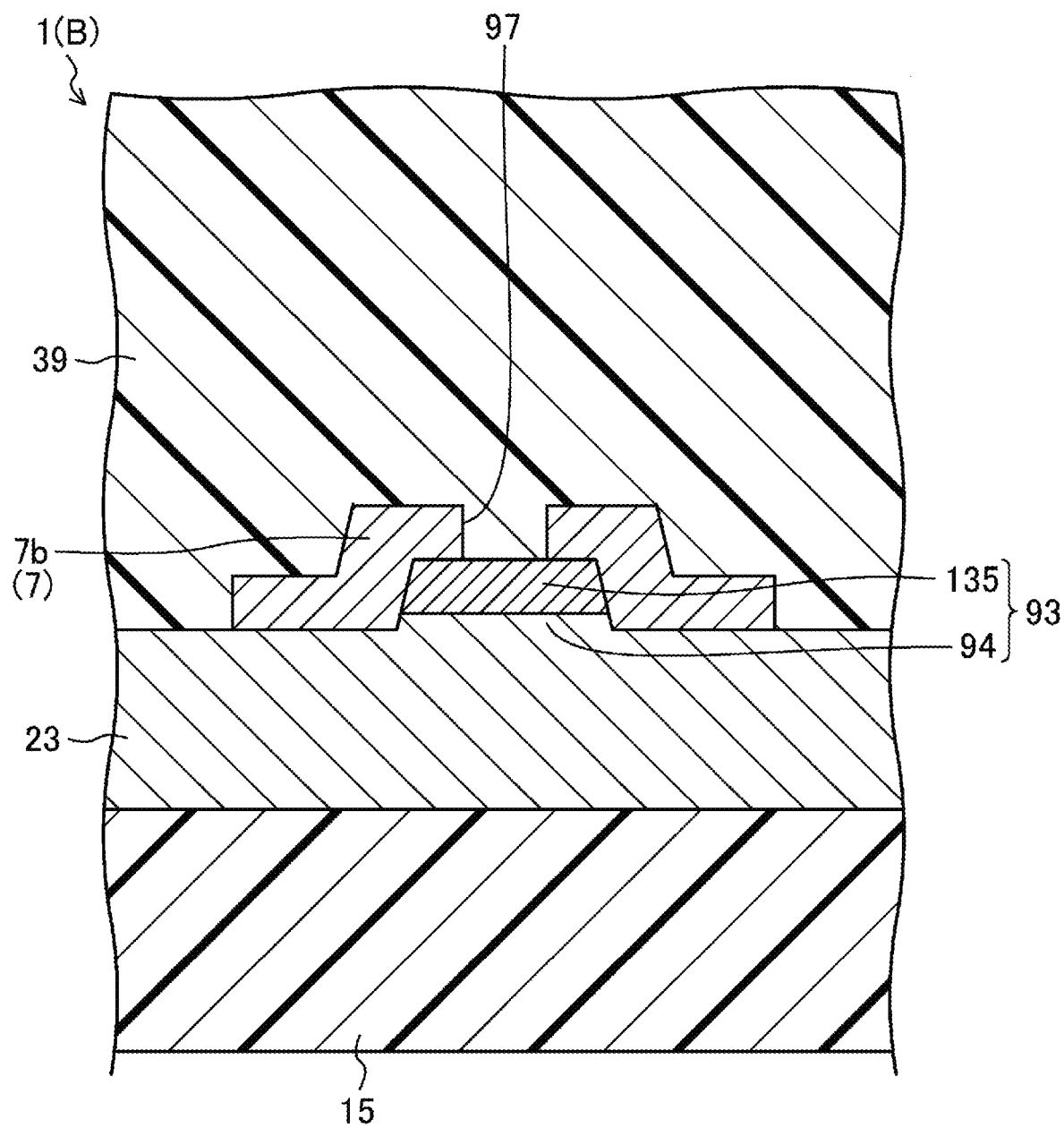
FIG. 21 is a cross-sectional view of an organic EL display device in a position corresponding to FIG. 9 according to a first modification example.

FIG. 21 is a cross-sectional view of an organic EL display device 1 in a position corresponding to FIG. 9 according to a first modification example. The organic EL display device 1 according to the first modification example is different from the organic EL display device 1 according to the first embodiment and the second embodiment in the configuration of the protruding portion 93 provided in the step portion 91 within the slit 81 in the bending portion B.

In the organic EL display device 1 according to the first modification example, as illustrated in FIG. 21, the protruding portion 93 is constituted with a protruding base portion 94 provided on the surface of the base coat layer 23, and a conductive layer 135 provided on the base portion 94. The conductive layer 135 is formed by the same material in the same layer as the semiconductor layer 25, and is a layer in which the semiconductor layer is made conductive. The second lead-out wiring line 7b that constitutes the lead-out wiring line 7 covers the perimeter edge surfaces of the conductive layer 135 that constitutes such a protruding portion 93, and is in contact with the conductive layer 135.

A method similar to the method for manufacturing the organic EL display device 1 according to the first embodiment described above is employed to the manufacturing of the organic EL display device 1 according to the first modification example, and instead of forming the conductive layer 96 that forms the protruding portion 93 in the gate conductive layer forming step S104, a semiconductor layer is formed at a location where the protruding portion 93 is to be formed in the semiconductor layer forming step S102, and the semiconductor layer is made conductive using a publicly known process. For example, in a case where the semiconductor layer is formed of an oxide semiconductor, the semiconductor layer can be made conductive by irradiating the semiconductor layer with ultraviolet rays or subjecting the semiconductor layer to plasma treatment with a reducing gas. In this way, the conductive layer 135 is formed.

Then, in the slit forming step S109, when the first slit 83 is formed in the base coat layer 23 and the second slit 85 is formed in the gate insulating layer 27, the first interlayer insulating layer 31, and the second interlayer insulating layer 35, the base portion 94 may be formed by etching a portion of the base coat layer 23 using the conductive layer 135 as a mask to form the island-shaped protruding portion 93.

Second Modification Example

Figure 22:
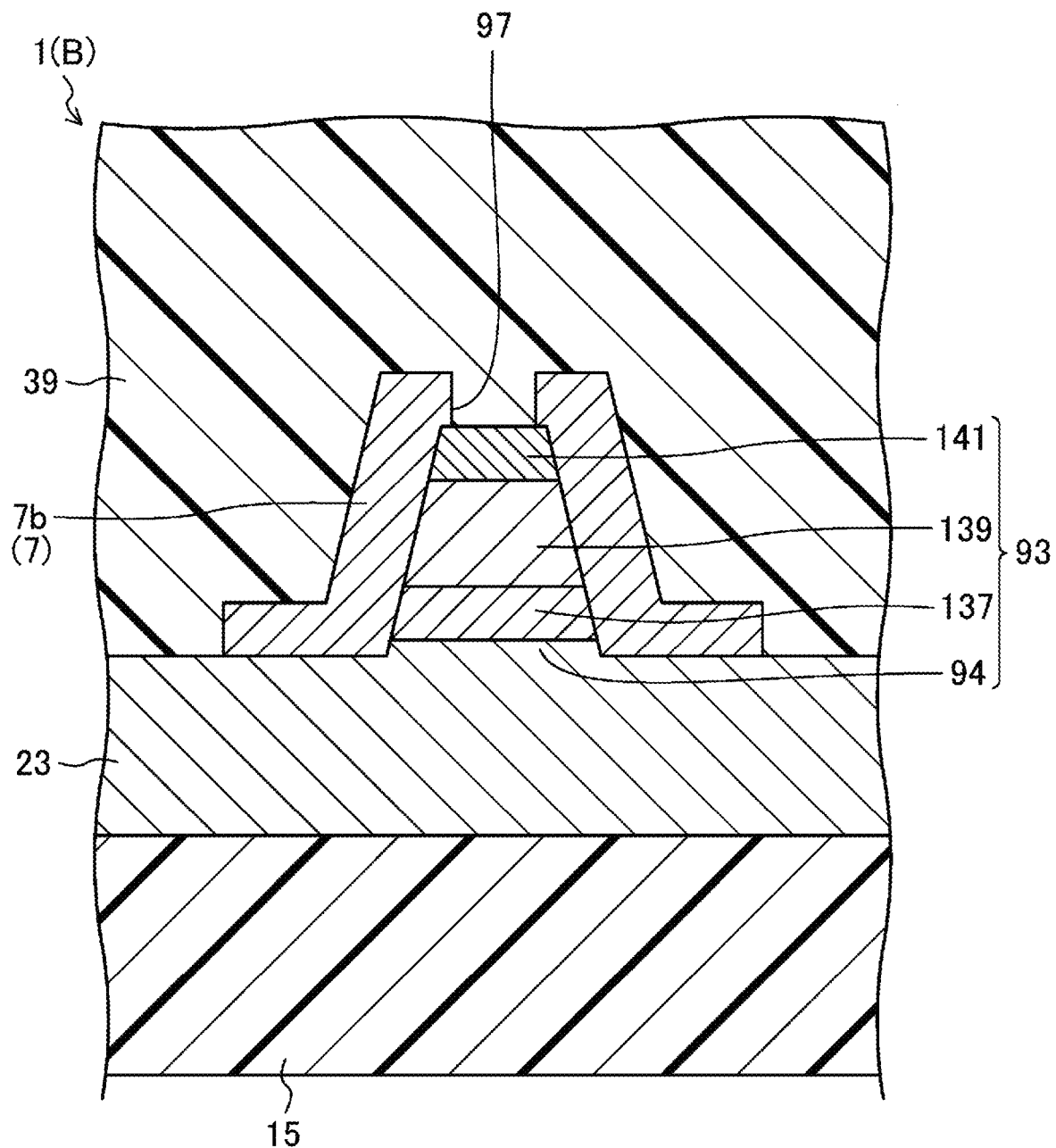
FIG. 22 is a cross-sectional view of an organic EL display device in a position corresponding to FIG. 9 according to a second modification example.

FIG. 22 is a cross-sectional view of an organic EL display device 1 in a position corresponding to FIG. 9 according to a second modification example. The organic EL display device 1 according to the second modification example is different from the organic EL display device 1 according to the first embodiment and the second embodiment in the configuration of the protruding portion 93 provided in the step portion 91 within the slit 81 in the bending portion B.

In the organic EL display device 1 according to the second modification example, as illustrated in FIG. 22, the protruding portion 93 is constituted with a protruding base portion 94 provided on the surface of the base coat layer 23, a first insulating layer 137 provided on the base portion 94, a second insulating layer 139 provided on the first insulating layer 137, and a conductive layer 141 provided on the second insulating layer 139.

The first insulating layer 137 is formed by the same material in the same layer as the gate insulating layer 27. The second insulating layer 139 is formed by the same material in the same layer as the first interlayer insulating layer 31. The conductive layer 141 is formed by the same material in the same layer as the initialization power source wiring line 53 and the second capacitance electrode 55. The conductive layer 141 is included in the intermediate conductive layer 33. The second lead-out wiring line 7b that constitutes the lead-out wiring line 7 covers the perimeter edge surfaces of the conductive layer 141 that constitutes such a protruding portion 93, and is in contact with the conductive layer 141.

A method similar to the method for manufacturing the organic EL display device 1 according to the first embodiment described above is employed to the manufacturing of the organic EL display device 1 according to the second modification example, and instead of forming the conductive layer 96 that forms the protruding portion 93 in the gate conductive layer forming step S104, the conductive layer 141 is formed at a location where the protruding portion 93 is to be formed in the intermediate conductive layer forming step S106.

Then, in the slit forming step S109, when the first slit 83 is formed in the base coat layer 23 and the second slit 85 is formed in the gate insulating layer 27, the first interlayer insulating layer 31, and the second interlayer insulating layer 35, the second insulating layer 139, the first insulating layer 137, and the base portion 94 may be formed by etching a portion of the first interlayer insulating layer 31, the gate insulating layer 27, and the base coat layer 23 using the conductive layer 141 as a mask to form the island-shaped protruding portion 93.

Third Modification Example

Figure 23:
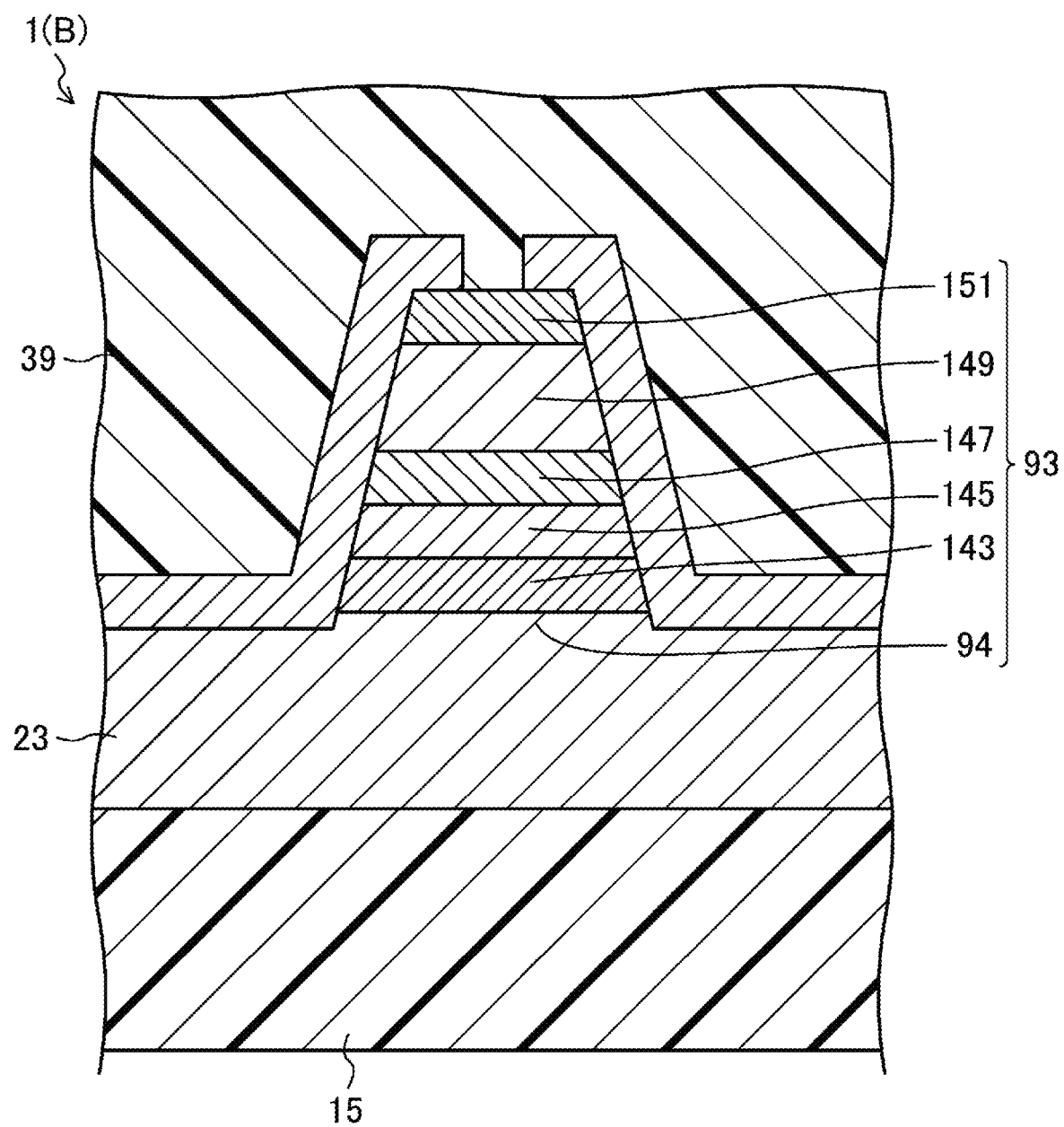
FIG. 23 is a cross-sectional view of an organic EL display device in a position corresponding to FIG. 9 according to a third modification example.

FIG. 23 is a cross-sectional view of an organic EL display device 1 in a position corresponding to FIG. 9 according to a third modification example. The organic EL display device 1 according to the third modification example is different from the organic EL display device 1 according to the first embodiment and the second embodiment in the configuration of the protruding portion 93 provided in the step portion 91 within the slit 81 in the bending portion B.

In the organic EL display device 1 according to the third modification example, as illustrated in FIG. 23, the protruding portion 93 is constituted with a protruding base portion 94 provided on the surface of the base coat layer 23, a first conductive layer 143 provided on the base portion 94, a first insulating layer 145 provided on the first conductive layer 143, a second conductive layer 147 provided on the first insulating layer 145, a second insulating layer 149 provided on the second conductive layer 147, and a third conductive layer 151 provided on the second insulating layer 149.

The first conductive layer 143 is formed by the same material in the same layer as the semiconductor layer 25, and is a layer in which the semiconductor layer is made conductive. The first insulating layer 145 is formed by the same material in the same layer as the gate insulating layer 27. The second conductive layer 147 is formed by the same material in the same layer as the gate wiring line 43 and the gate electrode 45. The first conductive layer 143 is included in the gate conductive layer 29.

The second insulating layer 149 is formed by the same material in the same layer as the first interlayer insulating layer 31. The third conductive layer 151 is formed by the same material in the same layer as the initialization power source wiring line 53 and the second capacitance electrode 55. The second conductive layer 147 is included in the intermediate conductive layer 33. The second lead-out wiring line 7b that constitutes the lead-out wiring line 7 covers the perimeter edge surfaces of the first conductive layer 143, the second conductive layer 147, and the third conductive layer 151 that constitute such a protruding portion 93, and is in contact with the first conductive layer 143, the second conductive layer 147, and the third conductive layer 151.

A method similar to the method for manufacturing the organic EL display device 1 according to the first embodiment described above is employed to the manufacturing of the organic EL display device 1 according to the third modification example, a semiconductor layer is formed at a location where the protruding portion 93 is to be formed in the semiconductor layer forming step S102, and the semiconductor layer is made conductive using a publicly known process, to form the first conductive layer 143. Furthermore, in the gate conductive layer forming step S104, the second conductive layer 147 is formed so as to overlap with the first conductive layer 143 with the gate insulating layer 27 interposed therebetween, and in the intermediate conductive layer forming step S106, the third conductive layer 151 is formed so as to overlap with the second conductive layer 147 with the first interlayer insulating layer 31 interposed therebetween.

Then, in the slit forming step S109, when the first slit 83 is formed in the base coat layer 23 and the second slit 85 is formed in the gate insulating layer 27, the first interlayer insulating layer 31, and the second interlayer insulating layer 35, the second insulating layer 149, the first insulating layer 145, and the base portion 94 may be formed by etching a portion of the first interlayer insulating layer 31, the gate insulating layer 27, and the base coat layer 23 using the third conductive layer 151 as a mask to form the island-shaped protruding portion 93.

In the third modification example, the protruding portion 93 includes the first conductive layer 143, the second conductive layer 147, and the third conductive layer 151. However, the protruding portion 93 may have a configuration including two conductive layers of the first to third conductive layers 143, 147, 151. In this case, the second lead-out wiring line 7b that constitutes the lead-out wiring line 7 covers the perimeter edge surfaces of the two conductive layers that constitutes the protruding portion 93, and may be electrically connected to the two conductive layers.

As described above, the preferred embodiments are described as examples of the technique of the present disclosure. However, the technique of the present disclosure is not limited to the embodiments and the modification examples, and is also applicable to an embodiment in which modification, replacement, adding, omission, and the like are suitably made. The constituent elements described in the embodiments described above can be combined into a new embodiment. The constituent elements described in the accompanying drawings and detailed description may also include constituent elements that are not essential for the purpose of solving the problems. As such, those constituent elements that are not essential should not be recognized as being essential immediately as described in the accompanying drawings and detailed description.

For example, the embodiments described above may be configured as follows.

In the first embodiment and the second embodiment described above, the first inorganic insulating film 24 is constituted with the base coat layer 23, and the second inorganic insulating film 36 is constituted with the gate insulating layer 27, the first interlayer insulating layer 31, and the second interlayer insulating layer 35, but the technique of the present disclosure is not limited to this. It is sufficient that both the first inorganic insulating film 24 and the second inorganic insulating film 36 include at least one inorganic insulating layer.

In the first embodiment and the second embodiment described above, the first slit 83 and the second slit 85 are formed after the groove-shaped recessed portion 99 is formed in the base coat layer 23, the gate insulating layer 27, the first interlayer insulating layer 31, and the second interlayer insulating layer 35 in manufacturing the organic EL display device 1, but the technique of the present disclosure is not limited to this. In manufacturing the organic EL display device 1, the second slit 85 may be formed after the first slit 83 is formed without forming the groove-shaped recessed portion 99 in the TFT layer 17, or the first slit 83 may be formed after the second slit 85 is formed.

In the first modification example described above, a configuration in which the protruding portion 93 includes the conductive layer 135 formed by making the semiconductor layer conductive has been illustrated, but the technique of the present disclosure is not limited to this. The protruding portion 93 may include a semiconductor layer that is not made conductive instead of the conductive layer 135.

The organic EL display device 1 has been described by taking as an example a case where the first electrode 101 is the anode electrode and the second electrode 104 is the cathode electrode. However, the technique of the present disclosure is not limited to this. The technique of the present disclosure is also applicable to, for example, the organic EL display device 1 including the organic EL layer 103 including a reversed layered structure in which the first electrode 101 is a cathode electrode and the second electrode 104 is an anode electrode.

The organic EL layer 103 is individually provided for each of the subpixels 5. However, the technique of the present disclosure is not limited to this. The organic EL layer 103 may be provided and shared by the plurality of subpixels 5. In this case, the organic EL display device 1 may include a color filter to perform color tone expression of each of the subpixels 5.

The three color subpixels 5 constituting each pixel 3 are provided in a stripe array. However, the technique of the present disclosure is not limited to this. The subpixels 5 constituting each pixel 3 is not limited to three colors, and may be four or more colors. The arrangement of the plurality of subpixels 5 constituting each pixel 3 may be arranged in other arrangements such as a PenTile arrangement.

The first to seventh TFTs 69a, 69b, 69c, 69d, 69e, 69f, and 69g employ the top gate structure. However, the technique of the present disclosure is not limited to this. The first TFT to seventh TFT 69a, 69b, 69c, 69d, 69e, 69f, and 69g may employ the bottom gate structure. The TFT 69 provided for each of the subpixels 5 may be eight or more, or may be six or less.

As an organic EL layer 103, the organic EL layer 103 of a five-layer layered structure including the hole injection layer 109, the hole transport layer 111, the light-emitting layer 113, the electron transport layer 115, and the electron injection layer 117 is illustrated. However, the technique of the present disclosure is not limited to this. For example, the organic EL layer 103 may adopt a three-layered structure including a hole injection-cum-transport layer, a light-emitting layer, and an electron transport-cum-injection layer, and can adopt any structure.

The organic EL display device 1 has been described as an example of a display device. However, the technique of the present disclosure is not limited to this. The technique of the present disclosure is applicable to a display device including a plurality of current-driven light-emitting elements, and is also applicable to, for example, a display device including a Quantum-dot Light Emitting Diode (QLED) that is a light-emitting element using a quantum dot-containing layer.

The invention claimed is:

1. A display device comprising:
   a resin substrate having flexibility; and
   a thin film transistor layer including a plurality of thin film transistors, the thin film transistor layer being provided on the resin substrate,
   the thin film transistor layer further including a first inorganic insulating film including a first inorganic insulating layer, a second inorganic insulating film including a second inorganic insulating layer provided on the first inorganic insulating film, and a lead-out wiring line provided on the second inorganic insulating film,
   the display device being provided with a display region configured to display an image generated by the plurality of thin film transistors, and a frame region located on a periphery of the display region,
   the frame region including a bending portion that is bent around a bending axis extending in a first direction,
   the bending portion being provided with a slit extending in the first direction in the thin film transistor layer,
   the slit comprising a first slit formed in the first inorganic insulating film and a second slit formed in the second inorganic insulating film with a width wider than a width of the first slit,
   portions of the first inorganic insulating film on both sides in a width direction of the first slit forming step portions that are exposed from the second inorganic insulating film inside the second slit,
   the lead-out wiring line being electrically connected to the thin film transistor layer, and extending from one side of the slit to the other side of the slit in a second direction intersecting with the first direction through the step portions,
   wherein the step portions are provided with a protruding portion having an island shape,
   the lead-out wiring line includes an opening covering a perimeter edge surface of the protruding portion and exposing an upper face of the protruding portion,
   the slit is provided with a buried layer landfilling the first slit, and
   the lead-out wiring line is in contact with the buried layer.

2. The display device according to claim 1,
   wherein the lead-out wiring line includes another opening exposing the buried layer at a portion corresponding to the first slit.

3. The display device according to claim 1,
   wherein a plurality of protruding portions, including the protruding portion, is provided for each lead-out wiring line and aligned in the second direction, and
   each of a plurality of lead-out wiring lines, including the lead-out wiring line, includes the opening covering the perimeter edge surfaces of a corresponding one of the plurality of the protruding portions and exposing the upper face of the corresponding one of the plurality of the protruding portions.

4. The display device according to claim 1,
   wherein a base coat layer, a semiconductor layer, a gate insulating layer, a first wiring line, a first interlayer insulating layer, a second wiring line, a second interlayer insulating layer, and a third wiring line are provided on the resin substrate in that order,
   the first inorganic insulating film includes the base coat layer as the first inorganic insulating layer,
   the second inorganic insulating film includes the gate insulating layer, the first interlayer insulating layer, and the second interlayer insulating layer as the second inorganic insulating layer, and
   the lead-out wiring line is included in the third wiring line.

5. The display device according to claim 4,
   wherein the protruding portion includes a conductive layer formed by a same material in a same layer as the second wiring line.

6. The display device according to claim 4,
   wherein the protruding portion includes a conductive layer formed by a same material in a same layer as the semiconductor layer, and
   the conductive layer is a layer in which a semiconductor layer is made conductive.

7. The display device according to claim 4,
   wherein the protruding portion includes at least two conductive layers of a conductive layer formed by a same material in a same layer as the semiconductor layer, a conductive layer formed by a same material in a same layer as the first wiring line, and a conductive layer formed by a same material in a same layer as the second wiring line.

8. The display device according to claim 4,
   wherein the protruding portion includes a conductive layer formed by a same material in a same layer as the first wiring line.

9. The display device according to claim 8,
   wherein the lead-out wiring line is in contact with the conductive layer.

10. The display device according to claim 4, further comprising:
    a light-emitting element layer including a plurality of light-emitting elements, the light-emitting element layer being provided on the thin film transistor layer.

11. The display device according to claim 10,
    wherein the plurality of light-emitting elements comprises organic electroluminescence elements.

* * * * *